(12) United States Patent
Tseng et al.

(10) Patent No.: US 9,406,629 B2
(45) Date of Patent: Aug. 2, 2016

(54) SEMICONDUCTOR PACKAGE STRUCTURE AND MANUFACTURING METHOD THEREOF

(71) Applicant: TAIWAN SEMICONDUCTOR MANUFACTURING COMPANY LTD., Hsinchu (TW)

(72) Inventors: Hua-Wei Tseng, New Taipei (TW); Shang-Yun Tu, Hsinchu (TW); Hsu-Hsien Chen, Hsinchu (TW); Hao-Juin Liu, Kaohsiung (TW); Chen-Shien Chen, Hsinchu County (TW); Ming Hung Tseng, Miaoli County (TW); Chita Chuang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/515,060

(22) Filed: Oct. 15, 2014

(65) Prior Publication Data

US 2016/0111384 A1    Apr. 21, 2016

(51) Int. Cl.
*H01L 23/31* (2006.01)
*H01L 25/065* (2006.01)
*H01L 23/00* (2006.01)

(52) U.S. Cl.
CPC ............ *H01L 24/05* (2013.01); *H01L 23/3157* (2013.01); *H01L 23/3171* (2013.01); *H01L 24/03* (2013.01); *H01L 24/16* (2013.01); *H01L 25/0657* (2013.01); *H01L 2224/0362* (2013.01); *H01L 2224/0391* (2013.01); *H01L 2224/03614* (2013.01); *H01L 2224/0401* (2013.01); *H01L 2224/05017* (2013.01); *H01L 2224/16145* (2013.01); *H01L 2224/16227* (2013.01); *H01L 2225/06513* (2013.01)

(58) Field of Classification Search
CPC .. H01L 24/05; H01L 23/3157; H01L 25/0657
USPC ................................................ 257/734, 411
See application file for complete search history.

(56) References Cited

U.S. PATENT DOCUMENTS

| 5,503,286 A * | 4/1996 | Nye, III | H01L 24/03 216/100 |
| 2003/0134436 A1* | 7/2003 | Yates | H01L 27/1085 438/1 |
| 2005/0142857 A1* | 6/2005 | Lee | H01L 21/76804 438/638 |
| 2008/0157235 A1* | 7/2008 | Rogers | H01L 21/02628 257/415 |
| 2010/0294329 A1* | 11/2010 | Fukushima | H01L 31/0512 136/244 |
| 2011/0147824 A1* | 6/2011 | Son | G11C 16/0483 257/324 |
| 2011/0155433 A1* | 6/2011 | Funaya | H01L 23/49827 174/258 |
| 2011/0221070 A1* | 9/2011 | Yen | H01L 23/3114 257/774 |
| 2011/0278734 A1* | 11/2011 | Yen | B81B 7/007 257/774 |
| 2011/0298123 A1* | 12/2011 | Hwang | H01L 24/05 257/737 |
| 2011/0309514 A1* | 12/2011 | Boomen | H01L 21/4832 257/773 |
| 2012/0007230 A1* | 1/2012 | Hwang | H01L 24/03 257/737 |
| 2014/0027922 A1* | 1/2014 | Uzoh | H01L 21/76898 257/774 |
| 2015/0014848 A1* | 1/2015 | Lin | H01L 24/81 257/737 |

* cited by examiner

*Primary Examiner* — Moazzam Hossain
(74) *Attorney, Agent, or Firm* — WPAT, P.C., Intellectual Property Attorneys; Anthony King

(57) ABSTRACT

A semiconductor package structure includes a first semiconductor substrate including a conductive pad; and a conductive pillar on the conductive pad and disposed between the first semiconductor substrate and a second semiconductor substrate. The conductive pad is coupled with a circuitry of the first semiconductor substrate. The conductive pillar extends along a longitudinal axis and toward the second semiconductor substrate. The conductive pillar includes a sidewall with a rough surface notching toward the longitudinal axis.

12 Claims, 33 Drawing Sheets

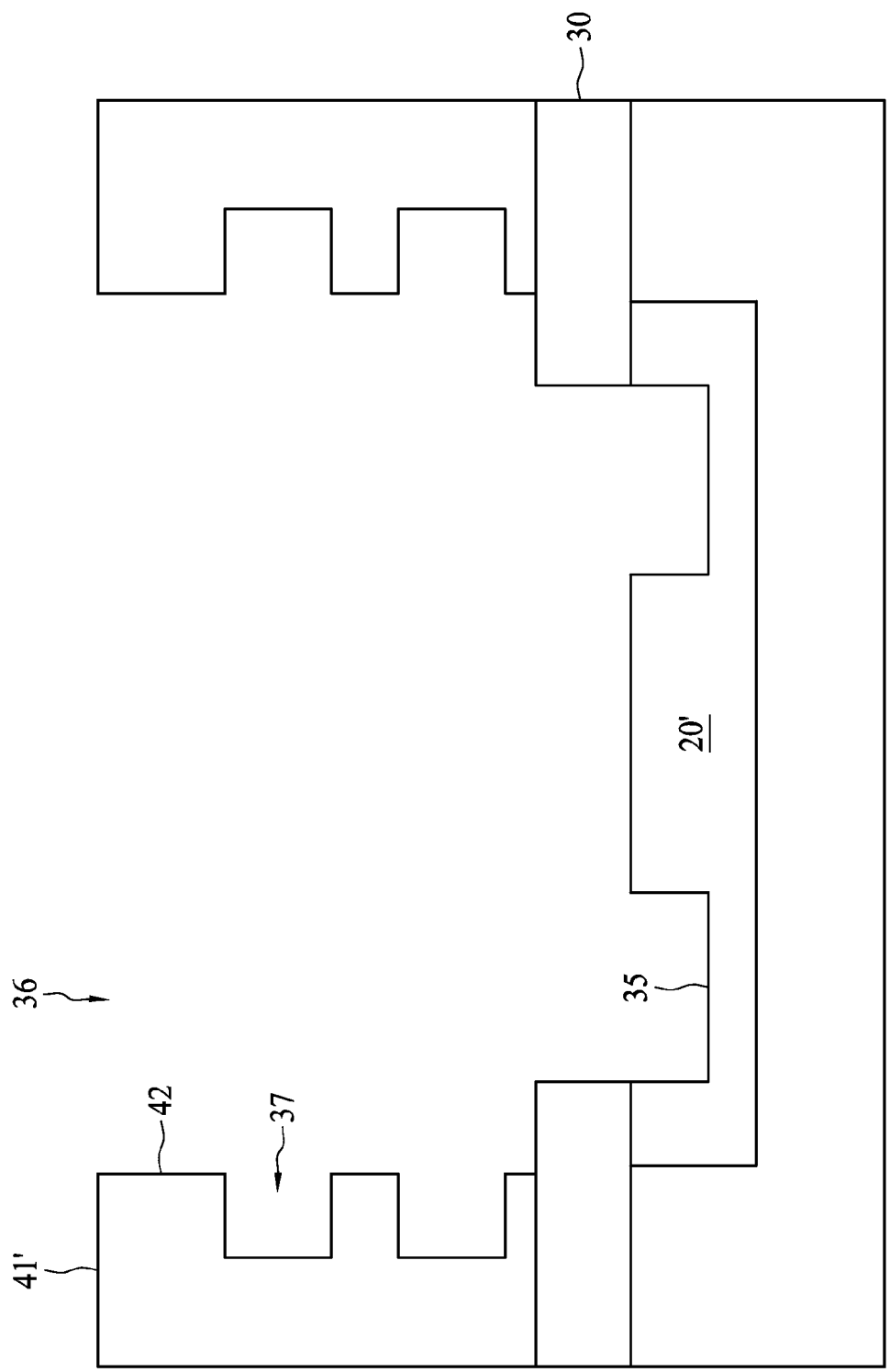

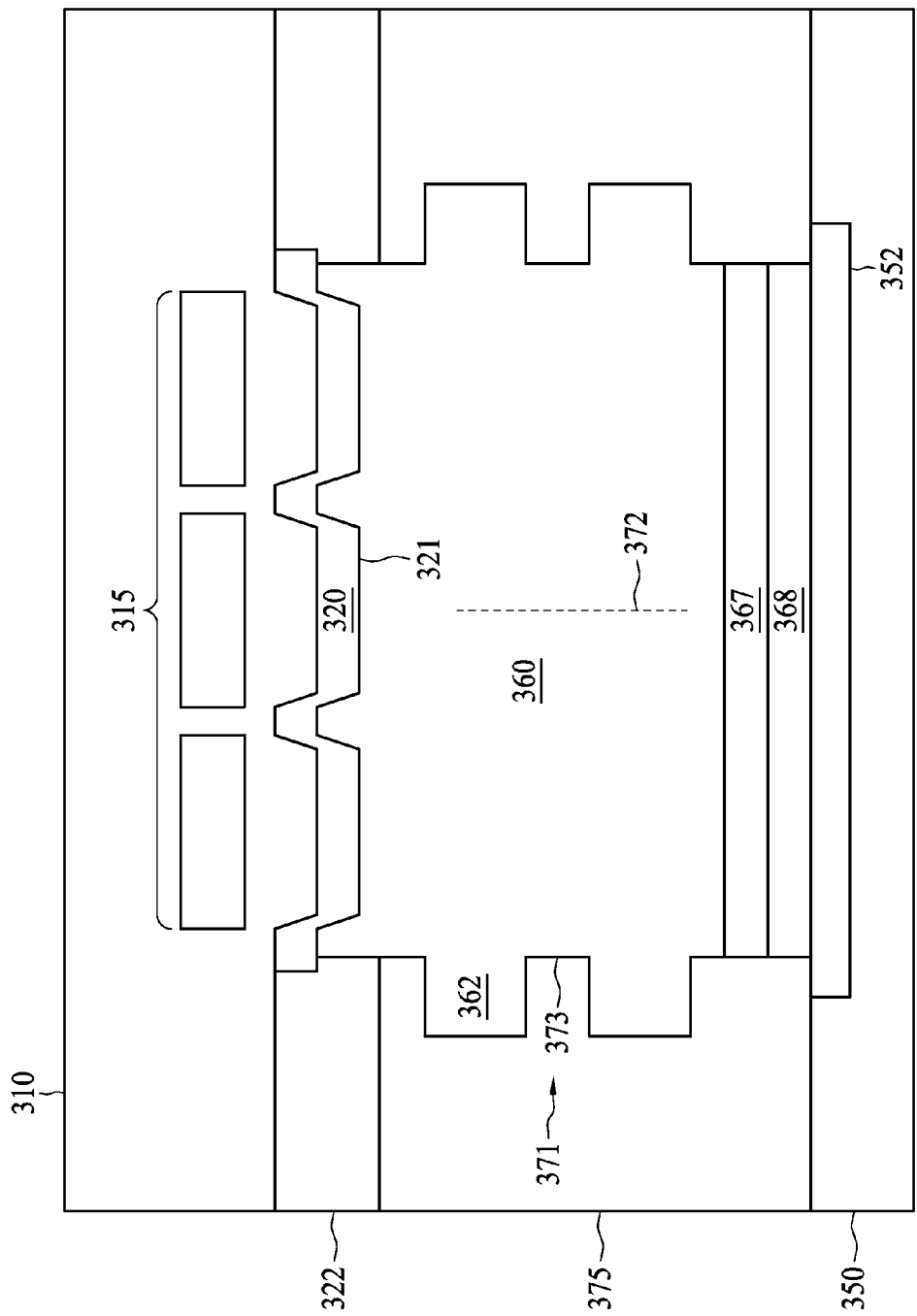

SEMICONDUCTOR PACKAGE STRUCTURE AND MANUFACTURING METHOD THEREOF

FIELD

The present disclosure relates to a semiconductor package structure, and more specifically to a structure of conductive pillar.

BACKGROUND

A significant trend throughout integrated circuit (IC) development is the downsizing of IC components. These integration improvements are two-dimensional (2D) in nature where the ICs are integrated on a surface of a semiconductor wafer. Although dramatic improvement in lithography has enabled greater results in 2D IC formation, there are physical limits to the density that can be achieved in two dimensions. Also, when more devices are put into one chip, more complex design costs are required.

In an attempt to further increase circuit density, three-dimensional (3D) ICs have been developed. For example, flip-chip packaging utilizes conductive bumps or conductive pillars to establish electrical contact between a chip and a semiconductor substrate. However, under a thermal cycle or a stress testing, an interface between the conductive pillars and other materials is subject to delamination or cracks. The interface is split by the stress and forms a crack, which extends to the conductive pillars or underlying wirings. The crack will affect the electrical performance and reliability of devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1K represent a method of manufacturing a semiconductor package structure in accordance with some embodiments of the present disclosure.

FIGS. 4A-4E represent a method of manufacturing a semiconductor package structure in accordance with some embodiments of the present disclosure.

DETAILED DESCRIPTION

Figure 1A:
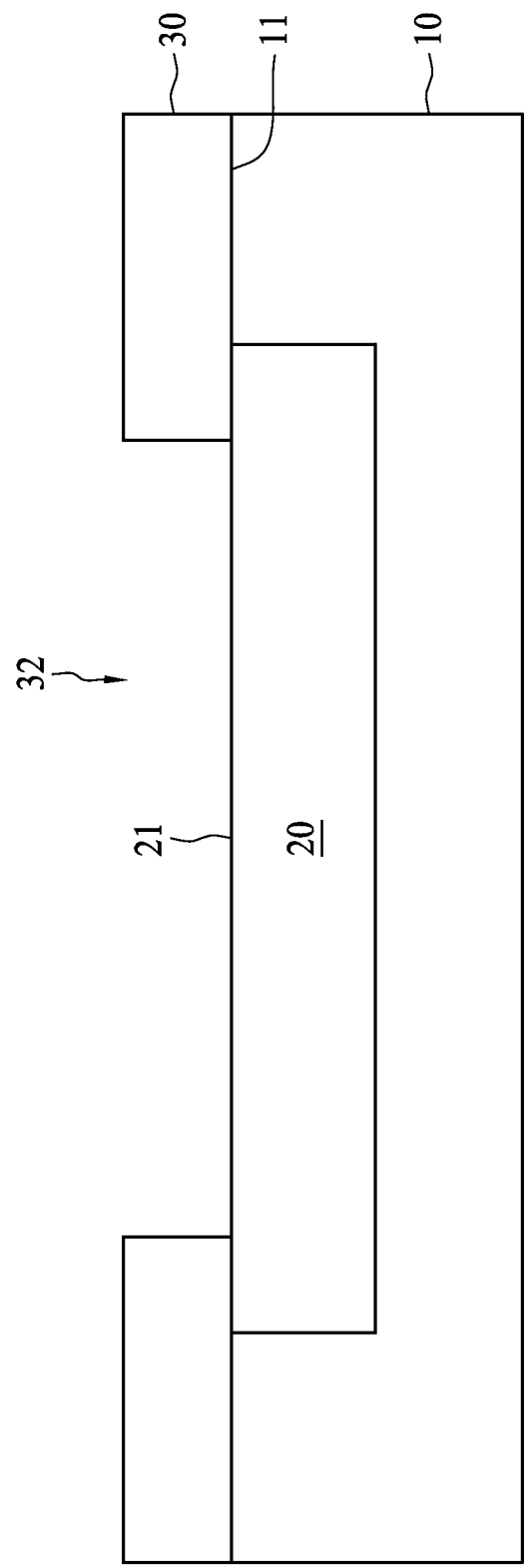

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "wafer" and "substrate," as used herein, are to be understood as including silicon, silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor does not need to be silicon-based, but could be based on silicon-germanium, germanium, gallium arsenide or other semiconductor structures.

The terms "deposition" and "deposit," as used herein, refer to operations of depositing materials on a substrate using a vapor phase of a material to be deposited, a precursor of the material, and an electrochemical reaction or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using an electrochemical reaction include electroplating, electro-less plating, and the like. Other examples of deposition include pulse laser deposition (PLD) and atomic layer deposition (ALD).

A current common requirement for an advanced electronic circuit is the use of multiple integrated circuit devices ("dies") integrated in a single packaged component. The flip chip technology plays an important role in the packaging of semiconductor devices. A flip chip microelectronic assembly includes a direct electrical connection of face-down electronic components onto substrates, such as wafers or circuit boards, by using conductive bumps and/or conductive pillars as the interconnections. The use of flip chip packaging has dramatically grown as a result of the advantages in size, performance, and flexibility of flip chips. Further, conductive pillar technology achieves finer pitch and a higher device density, which reduces the capacitance load of the circuits, and allows the electronic components to perform at higher frequencies.

However, the structure of the conductive pillar has some issues. For example, an interface between the conductive pillar and the underfill material is subject to delamination. In another example, an interface between the conductive pillar and the passivation layer is also subject to delamination or cracks. The delamination or cracks may start along the interfaces between the conductive pillar and other materials and then transfer to the conductive pillar, the underfill material or the passivation layer, resulting in a lower reliability or worse electrical performance. The cracks or delamination result from a temperature coefficient mismatch or a stressing test before export. Since there is a thermal mismatch between the conductive pillars and other materials, the interface between the conductive pillar and other materials is subject to splits caused by the physical stress of different temperature coefficients. During mounting processes, the conductive pillar and other materials are heated and cooled down repeatedly in a thermal cycling. Since the conductive pillar has a temperature coefficient different from those of other materials, the different temperature coefficients cause different thermal expansion. The different thermal expansion causes physical stress on the interfaces so as to split the interfaces, and resulting in cracks or delamination. In other situations, the package receives a stressing test before the products are transported to the clients. During reliability stressing, mechanical pressure is imposed on the packages. The mechanical pressure tears the interfaces and causes delamination or cracks. The delamination may cause serious reliability concerns and worse performance.

The present disclosure provides a semiconductor package structure and a method thereof to enhance adhesion ability between the conductive pillars and other materials, such as underfill, passivation or dielectric layers, in order to avoid splitting. Due to higher adhesion ability, the delamination or cracks can be reduced or avoided.

FIGS. 1A-1K represent a method of manufacturing a semiconductor package structure in accordance with some embodiments of the present disclosure. Each figure represents a stage of the method in a cross-sectional perspective view.

Referring to FIG. 1A, a semiconductor substrate 10 having a conductive pad 20 is provided. The semiconductor substrate 10 is made of semiconductor materials, for example, bulk silicon, a semiconductor wafer, silicon-on-insulator (SOI) substrates, or a silicon germanium substrate. Other semiconductor materials include group III, group IV, and group V elements are also used. Further, the semiconductor substrate 10 includes circuitry and a plurality of isolation features (not shown), such as shallow trench isolation (STI) features or local oxidation of silicon (LOCOS) features. The isolation features define and isolate the various microelectronic elements (not shown) of the circuitry. Examples of the various microelectronic elements in the semiconductor substrate 10 include transistors (e.g., metal oxide semiconductor field effect transistors (MOSFETs), p-channel and/or n-channel field effect transistors (PFETs/NFETs), complementary metal oxide semiconductor (CMOS) transistors, bipolar junction transistors (BJTs), high voltage transistors, high frequency transistors, resistors, diodes, capacitors, inductors, fuses, and other suitable elements. The microelectronic elements are integrated to form the circuitry with certain functions, such as a logic device, memory device (e.g., SRAM, FLASH or EEPROM), RF device, input/output (I/O) device, system-on-chip (SoC) device, baseband transceivers, graphics processors, cache memory devices, memory management devices, and analog to digital converters.

The conductive pad 20 is located on the top of the semiconductor substrate 10 and exposed on a surface 11 of the semiconductor substrate 10, wherein the conductive pad 20 is coupled with the circuitry. Further, the conductive pad 20 is implemented as a metallization layer, which is a portion of conductive routes and has an exposed surface 21. Suitable materials for the conductive pad 20 include, for example, copper (Cu), aluminum (Al), AlCu, copper alloy, or other mobile conductive materials. The conductive pad 20 provides electrical connections between the circuitry of the semiconductor substrate 10 and external devices of another substrate. The conductive pad 20 is also served as a terminal or an input/output port of the circuitry.

A dielectric layer 30 or a passivation layer is deposited on the surface 11 of the semiconductor substrate 10 by chemical vapor deposition (CVD). Later, lithography and etching processes are performed to partially or completely expose the conductive pad 20, thus forming an opening 32. The dielectric layer 30 is made of dielectric material for insulating the underlying wiring, wherein the dielectric material includes, for example, oxide or nitride. The dielectric layer 30 also passivates the surface 11 to a non-active surface. In an embodiment, a polymeric layer (not shown) is deposited on the dielectric layer 30, wherein the polymeric layer is made of one or two suitable polymer materials such as epoxy, polyimide (PI), benzocyclobutene (BCB), polybenzoxazole (PBO), photosensitive polyimide material (PSPI), or soft organic materials. The polymeric layer provides a stress relief for the interconnecting regions during a thermal cycle or a stress testing.

Figure 1B:
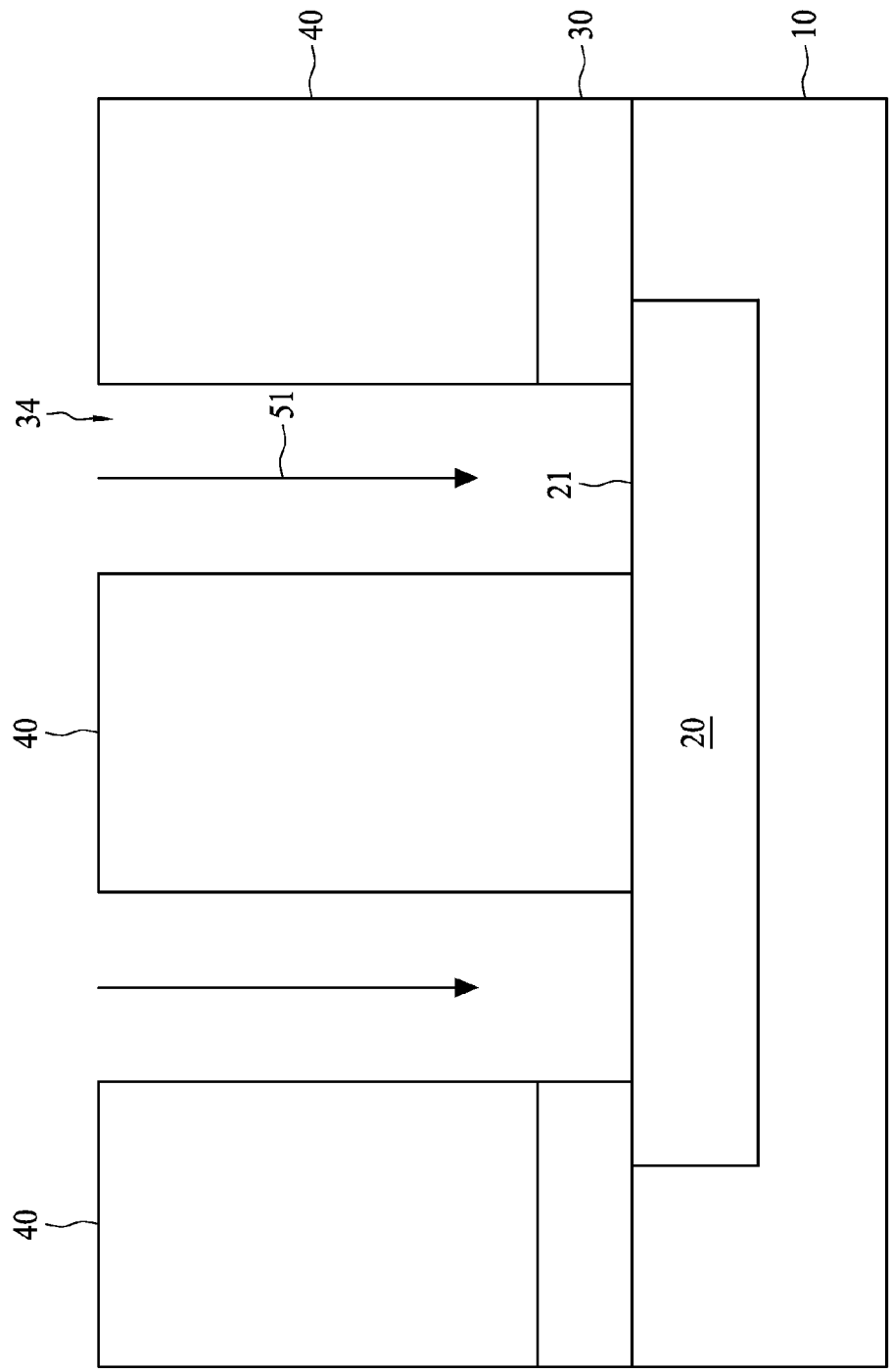

Referring to FIG. 1B, a patterned photoresist 40 or a mask layer is formed over the semiconductor substrate 10, wherein the patterned photoresist 40 includes openings 34 exposing a portion of the exposed surface 21. Further, the patterned photoresist 40 covers the dielectric layer 30 and a portion of the exposed surface 21. The openings 34 have a predetermined width and are arranged periodically or randomly on the conductive pad 20. For example, there are at least two openings 34 or tens of openings exposing the exposed surface 21.

Later, an etch process 51 is performed to etch the conductive pad 20 through the openings 34. The etch process 51 utilizes a wet etching or a dry etching process with an anisotropy feature or an isotropy feature, for example, a reactive ion etch (RIE). The etch process 51 includes chemistry molecule, which is ionized and reacts with materials of the conductive pad 20, but not the patterned photoresist 40. Further, the etch process 51 includes a chemistry molecule such as $Cl_2$, $SF_6$, $N_2$, $CF_4$, $CHF_3$, $CH_2F_2$, $N_2H_2$, $O_2$, He or Ar.

Figure 1C:
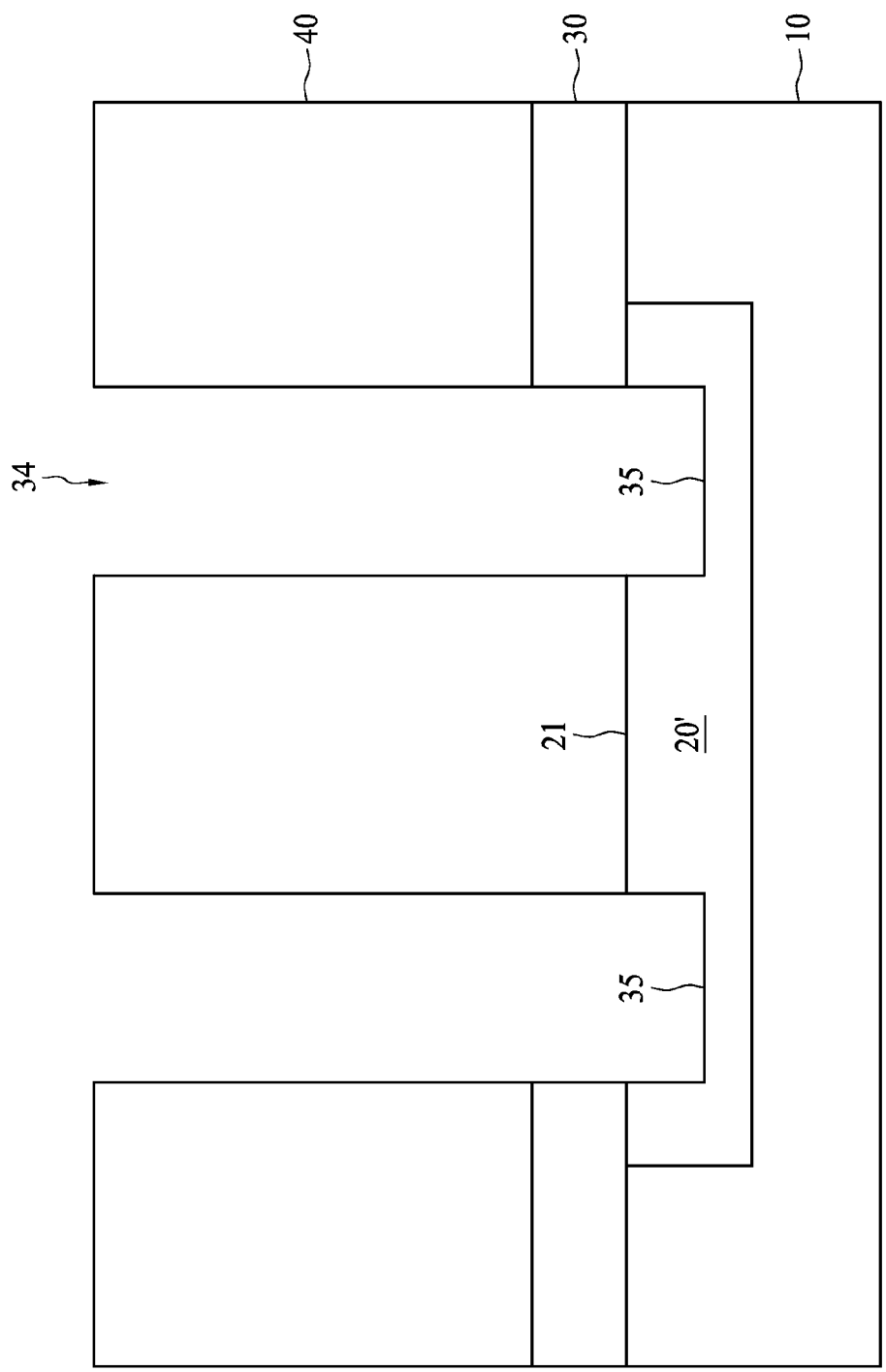

Referring to FIG. 1C, the conductive pad 20 is etched and transformed into a conductive pad 20'. The conductive pad 20' thus includes a plurality of recesses 35, which increase degree of surface roughness of the exposed surface 21. The plurality of recesses 35 are shaped as rectangular, triangular or curved recesses in accordance with the etch process 51 and the patterned photoresist 40. The patterned photoresist 40 is then stripped by a liquid solution or a plasma ashing.

Figure 1D:
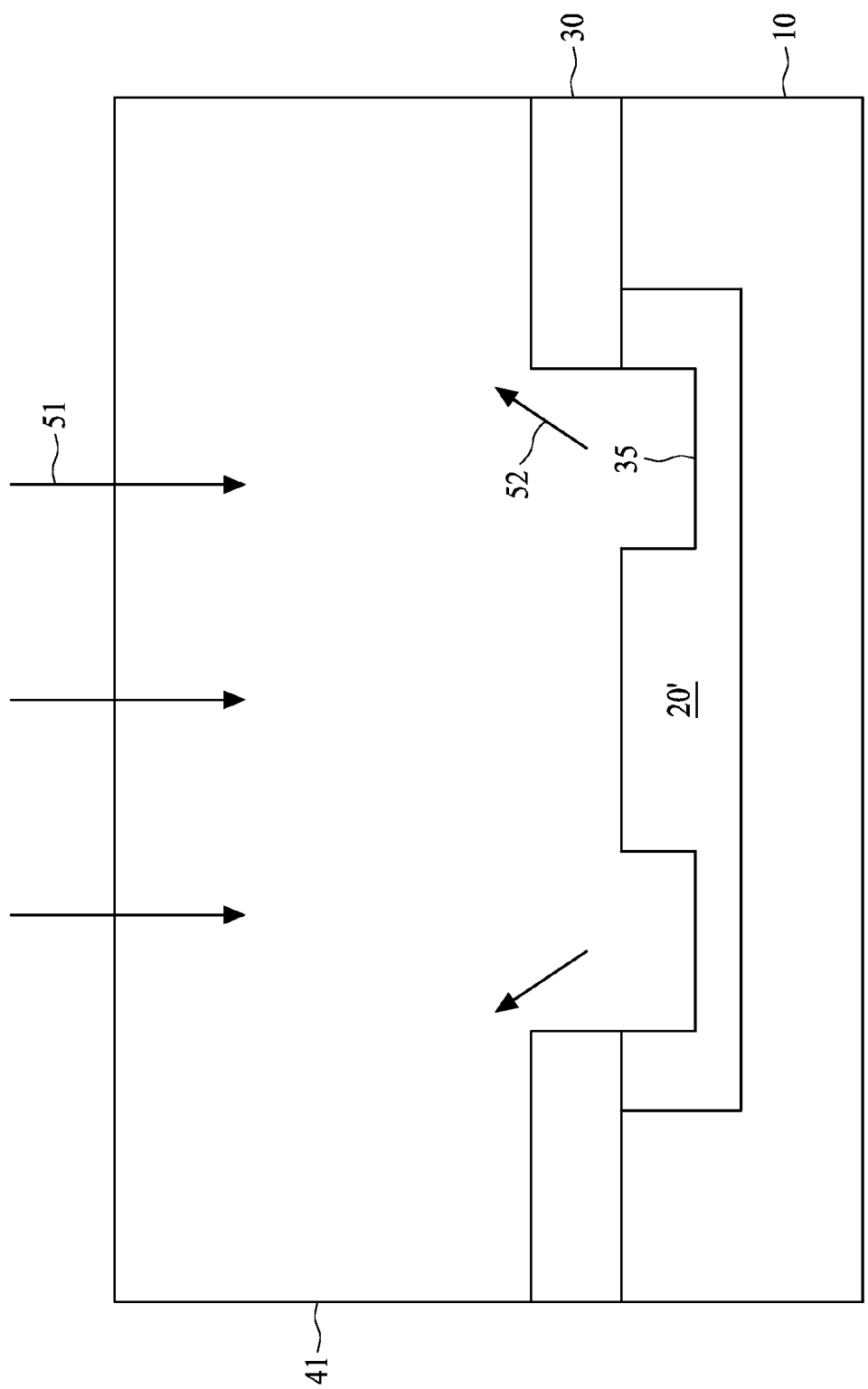

Referring to FIG. 1D, a photoresist 41 is deposited over the semiconductor substrate 10. The photoresist 41 is exposed under a light beam 51, wherein the light beam 51 includes a wave length, for example, within an ultraviolet region or a far ultraviolet region. The light beam 51 is emitted straight downwardly through a mask (not shown) and reflected by the conductive pad 20'. The mask directs the light beam 51 moving downwardly to a specific region, for example, the conductive pad 20'. Since the conductive pad 20' includes the recesses 35, the light beam 51 is then scattered by the rough surface. Light beams 52 represent the light beam 51 scattered from the conductive pad 20'. The light beams 52 are redirected laterally out of the specific region, thus causing a lateral exposure. Later, the photoresist 41 is immersed into a solution for developing.

Referring to FIG. 1E, after the process of developing, the photoresist 41 is developed and transformed into a photoresist 41', which is a remaining portion of the photoresist 41. The photoresist 41' includes an opening 36 exposing the conductive pad 20'. In the cross-sectional view of FIG. 1E, the opening 36 has a width greater than a width of the conductive pad 20'. The lateral exposure by the light beams 52 causes sidewalls 42 of the photoresist 41' including a plurality of cavities 37 after developing. The cavities 37 are arranged as a rectangular shape, a sawtooth shape or a curved shape. The quantity and positions of the cavities 37 depend on positions of the recesses 35 of the conductive pad 20'. For example, if a recess 35 is located on an edge of the conductive pad 20', the scattering of the light beam 52 is enhanced near the recess 35. After developing, the sidewall 42 near the recess 35 may have a higher amount of cavities.

Figure 1F:
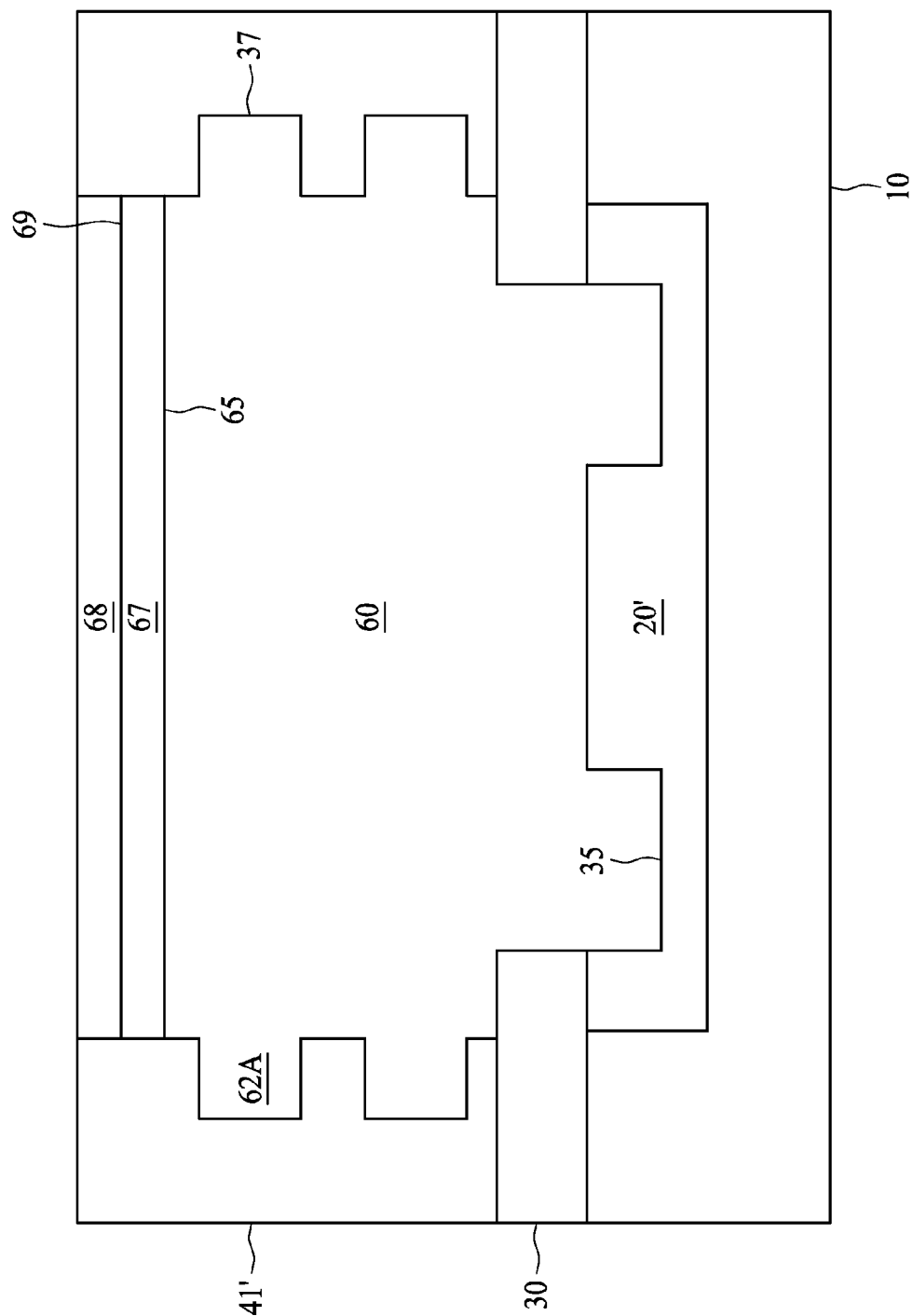

Referring to FIG. 1F, a conductive material is deposited in the opening 36 and the cavities 37 by evaporation, electroplating, or screen printing, thus forming a conductive pillar 60. The conductive material is drawn to the cavities 37 and forms a plurality of protruded portions 62A. The protruded portions 62A are shaped by the formation of the cavities 37 in the photoresist 41'. Materials of the conductive material include, for example, pure copper, an alloy of copper or other suitable materials. The conductive pillar 60 contacts with the conductive pad 20' and fills the recesses 35. In an embodiment, an under bump metallization (UBM, not shown) is deposited on the conductive pad 20' prior to the deposition of the conductive pillar 60. The UBM provides a better adhesion between the conductive pillar 60 and the conductive pad 20' and serves as a diffusion barrier layer.

Next, a cap layer 67 is formed on a top surface 65 of the conductive pillar 60 within the opening 36. The cap layer 67 acts as a barrier layer to prevent copper in the conductive pillar 60 from diffusing into bonding material, such as solder alloy, which is used to bond the semiconductor substrate 10 to external features. The cap layer 67 also increases the reliability and bonding strength of the package. The cap layer 67 is made of at least one of nickel (Ni), tin, tin-lead (SnPb), gold (Au), silver, palladium (Pd), indium (In), nickel-palladium-gold (NiPdAu), nickel-gold (NiAu), other similar materials, or alloys. In some embodiments, the cap layer 67 is a multi-layer structure, and each layer includes at least one of Ni, Au, Pd, Ni-base alloy, Au-base alloy, or Pd-base alloy. In some embodiments, the cap layer 67 is a Ni film or a Ni alloy film formed by an electroplating process, electroless plating process or immersion plating process.

A solder layer 68 is formed on a top surface 69 of the cap layer 67 in the opening 36. The solder layer 68 is made of Sn, SnAg, SnAgCu, SnAgZn, SnZn, SnBiIn, SnIn, SnAu, SnPb, SnCu, SnZnIn, or SnAgSb, etc., and formed by plating processes. In some embodiments, the solder layer 68 is a lead-free solder layer, such as SnAg with Ag content.

Figure 1G:
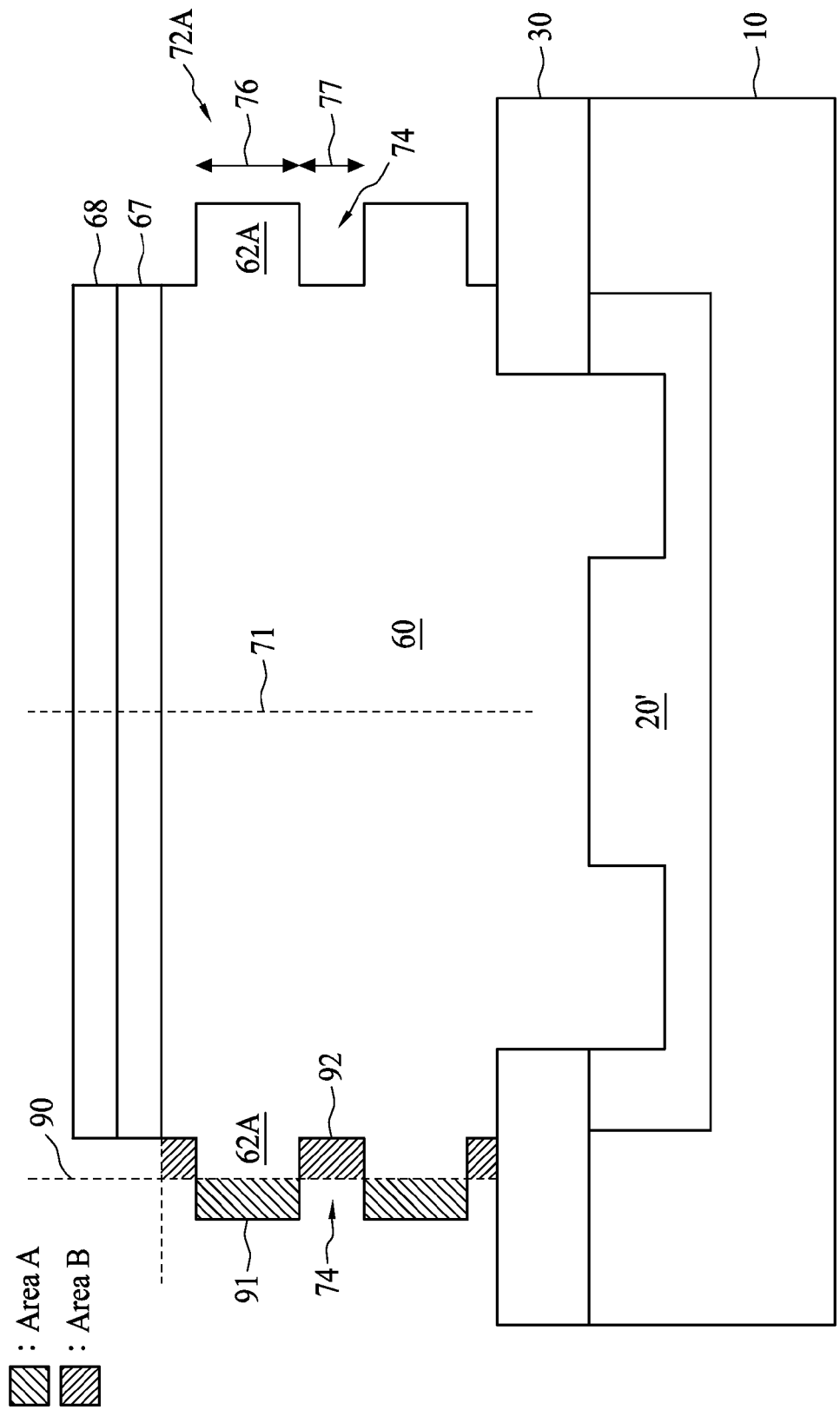

Referring to FIG. 1G, the photoresist 41' is stripped by a chemical solution or plasma ashing. The conductive pillar 60 protrudes from the conductive pad 20', wherein the conductive pillar 60 extends along a longitudinal axis 71. The conductive pillar 60 includes a sidewall 72A with a rough surface notching toward the longitudinal axis 71. The sidewall 72A includes a plurality of protruded portions 62A and a plurality of notches 74, thus increasing degree of surface roughness of the sidewall 72A. In some embodiments, the protruded portions 62A and notches 74 are arranged periodically, wherein each protruded portion 62A has a length 76 parallel to the longitudinal axis 71 being greater than a length 77 of each notch 74. Alternatively, a ratio of the length 76 and the length 77 is predetermined in advance. Positions of the protruded portions 62A and notches 74 are symmetrical on both sides of the sidewalls 72A. The conductive pillar 60 overlaps a portion of the dielectric layer 30 and includes a width greater than that of the conductive pad 20'.

In an embodiments, the sidewall 72A has a roughness (Ra) greater than about 2 μm In some embodiments, the sidewall 72A has a roughness (Ra) of about 1 μm to about 3 μm. The roughness (Ra) is the average of the individual heights (asperities) and depths from the arithmetic mean elevation of the profile, which is also called average roughness (Ra) and will be further discussed as follows. A reference line 90 is defined within the sidewall 72A for measuring the roughness (Ra). The reference line 90 is defined at a position where a sum of areas of the protruded portion 62A (area A) is substantially equal to a sum of areas of the notches 74 (area B). After defining the reference line 90, vertical distances between each point on an outer edge 91 of the protruded portion 62A and the reference line 90 are obtained. Similarly, vertical distances between each point on an inner edge 92 of the notches 74 and the reference line 90 are obtained. The roughness (Ra) of the sidewall 72A is an arithmetic average of the vertical distances between the reference line 90 and the sample points on the inner edge 92 or the outer edge 91.

Figure 1J:
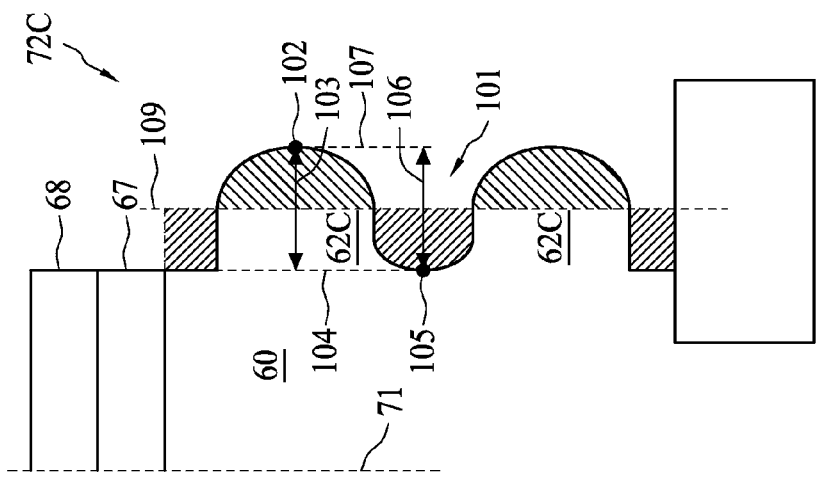
Figure 1I:
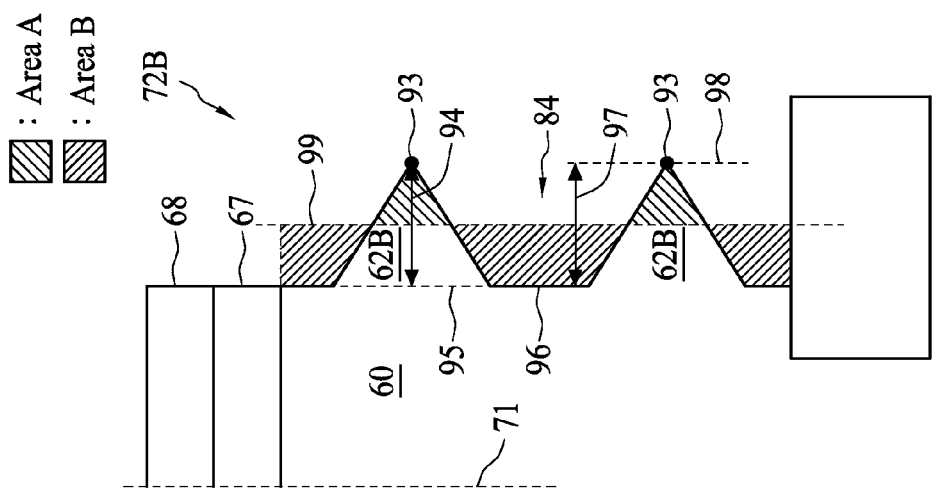
Figure 1H:
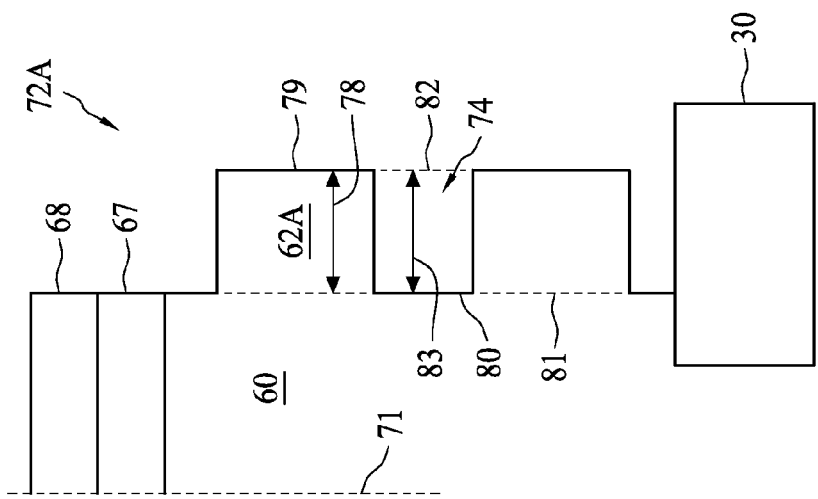

Referring to FIG. 1H, it depicts a zoom-in diagram of the sidewall 72A of FIG. 1G. The protruded portions 62A have a rectangular shape protruding away from the longitudinal axis 71. Each protruded portion 62A includes a width 78, wherein the width 78 is measured from a reference line 81, which extends from an inner sidewall 80 of the notch 74, to an outer sidewall 79 of the protruded portions 62A. The notches 74 recess toward the longitudinal axis 71, wherein the notches 74 also have a rectangular shape. Each notch 74 has a width 83, measured from a reference line 82, which extends from the outer sidewall 79 of the protruded portions 62A, to the inner sidewall 80 of an adjacent notch 74. The width 83 is equivalent to the width 78. In an embodiment, the width 78 is greater than 2 μm. In an embodiment, the width 78 ranges from about 2 μm to 3.5 μm.

Referring to FIG. 1I, the conductive pillar 60 includes a sidewall 72B, wherein the sidewall 72B includes a plurality of protruded portions 62B and notches 84. The protruded portions 62B have a triangular shape or a sawtooth shape protruding away from the longitudinal axis 71. In some embodiments, each protruded portion 62B is arranged periodically with a predetermined interval ranging from about 0.1 μm to 1.5 μm. Further, each protruded portion 62B includes a vertex 93, which is a distal end point that is away from the longitudinal axis 71. Each protruded portion 62B includes a width 94, wherein the width 94 is measured from a reference line 95, which extends from an inner sidewall 96 of the notch 84, to the vertex 93. Each protruded portion 62B has the same width 94, which is greater than 2 μm. The notches 84 recess toward the longitudinal axis 71, wherein the notches 84 have a trapezoid shape or a triangular shape. Each notch 84 has a width 97, wherein the width 97 is measured from a reference line 98, which extends from a vertex 93 of the protruded portion 62B, to the inner sidewall 96. In an embodiment, the width 97 is greater than 2 μm. In an embodiment, the width 97 ranges from about 2 μm to 3.5 μm.

The sidewall 72B has a roughness (Ra) greater than about 2 μm. In some embodiments, the sidewall 72B has a roughness (Ra) of about 1 μm to about 3 μm. A reference line 99 is defined within the sidewall 72B for measuring the roughness (Ra). The reference line 99 is defined at a position where a sum of areas of the protruded portion 62B (area A) is substantially equal to a sum of areas of the notches 84 (area B). After defining the reference line 99, vertical distances between each point on outer edges of the protruded portion 62B and the reference line 99 are obtained. Similarly, vertical distances between each point on inner edges of the notches 84 and the reference line 99 are obtained. The roughness (Ra) of the sidewall 72B is an arithmetic average of the vertical distances between the reference line 99 and the sample points on the outer edges of the protruded portion 62B or the inner edges of the notches 84.

Referring to FIG. 1J, the conductive pillar 60 includes a sidewall 72C, wherein the sidewall 72C includes a plurality of protruded portions 62C and notches 101. The protruded portions 62C have a curved shape or a spherical shape protruding away from the longitudinal axis 71. In some embodiments, each protruded portion 62C is arranged periodically with a predetermined interval ranging from about 0.1 μm to 1.5 μm. Further, each protruded portion 62C includes an outermost point 102, which is a distal end point that is away from the longitudinal axis 71. Each protruded portion 62C includes a width 103, wherein the width 103 is measured from a reference line 104, which extends from an innermost point 105 of the notch 101, to the outermost point 102. Each protruded portion 62C has the same width 103, which is greater than 2 μm. The notches 101 recess toward the longitudinal axis 71, wherein the notches 101 have a curved shape or a spherical shape. Each notch 101 has a width 106, wherein the width 106 is measured from a reference line 107, which extends from the outermost point 102 of the protruded portion 62C, to the innermost point 105. In an embodiment, the width 106 is greater than 2 μm. In an embodiment, the width 106 ranges from about 2 μm to 3.5 μm.

The sidewall 72C has a roughness (Ra) greater than about 2 μm. In some embodiments, the sidewall 72C has a roughness (Ra) of about 1 μm to about 3 μm. A reference line 109 is defined within the sidewall 72C for measuring the roughness (Ra). The reference line 109 is defined at a position where a sum of areas of the protruded portion 62C (area A) is substantially equal to a sum of areas of the notches 101 (area B). After defining the reference line 109, vertical distances between each point on outer curves of the protruded portion 62C and the reference line 109 are obtained. Similarly, vertical distances between each point on inner curves of the notches 101 and the reference line 109 are obtained. The roughness (Ra) of the sidewall 72C is an arithmetic average of the vertical distances between the reference line 109 and the sample points on the outer curves of the protruded portion 62C or the inner curves of the notches 101.

Figure 1K:
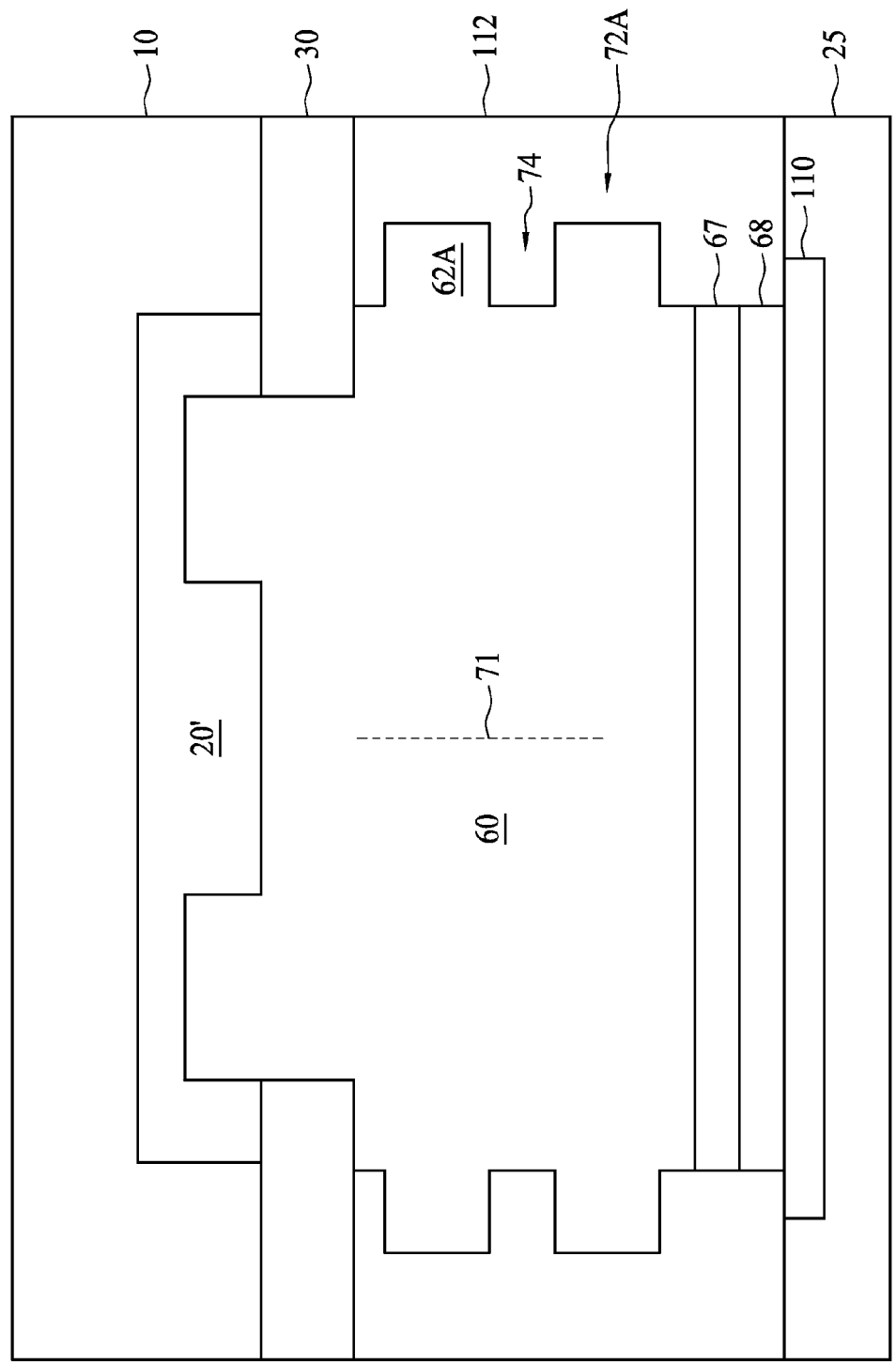

Referring to FIG. 1K, it depicts that the semiconductor substrate 10 is mounted on a semiconductor substrate 25 or a circuit board. During the mounting process with the semiconductor substrate 25, the semiconductor substrate 10 is flipped upside down and aligned with a conductive region 110 of the semiconductor substrate 25. The solder layer 68 is in contact with the conductive region 110. A reflow process is performed to soften the solder layer 68 for electrical connection and mechanical attachment between the conductive pillar 60 and the semiconductor substrate 25. As such, the conductive pillar 60 extends along the longitudinal axis 71 and toward the semiconductor substrate 25. After the conductive pillar 60 is connected to the semiconductor substrate 25, an underfill 112 is dispensed into gaps between the semiconductor substrate 10 and the semiconductor substrate 25. The underfill 112 is dispensed along edges of the semiconductor substrate 10 by using syringes or needles and drawn into the notches 74 by capillary action. Further, the underfill 112 surrounds the conductive pillar 60 and then is cured. The underfill material includes, for example, compliant epoxies that are liquid at temperatures above room temperature, and have rapid cure times especially at elevated temperatures and low viscosity during dispensing. The underfill 112 provides a flexible compliant material surrounding the conductive pillar 60 and an adhesion between the semiconductor substrate 10 and the semiconductor substrate 25. Further, the underfill 112 provides a stress relief during thermal cycling so as to prevent the conductive pillar 60 from cracking.

The protruded portion 62A and the notches 74 increase degree of surface roughness of the sidewall 72A so that a contact area of the conductive pillar 60 and other materials is increased. The adhesion ability between the conductive pillar 60 and other materials, such as the underfill 112 or the dielectric layer 30, is enhanced so as to avoid splitting. Due to higher adhesion ability, the delamination or cracks from the interface between the conductive pillar 60 and other materials can be reduced or avoided during a stress testing or a thermal cycle.

FIGS. 2A-2G represent a method of manufacturing a semiconductor package structure in accordance with some embodiments of the present disclosure. Each figure represents a stage of the method in a cross-sectional perspective view.

Figure 2A:
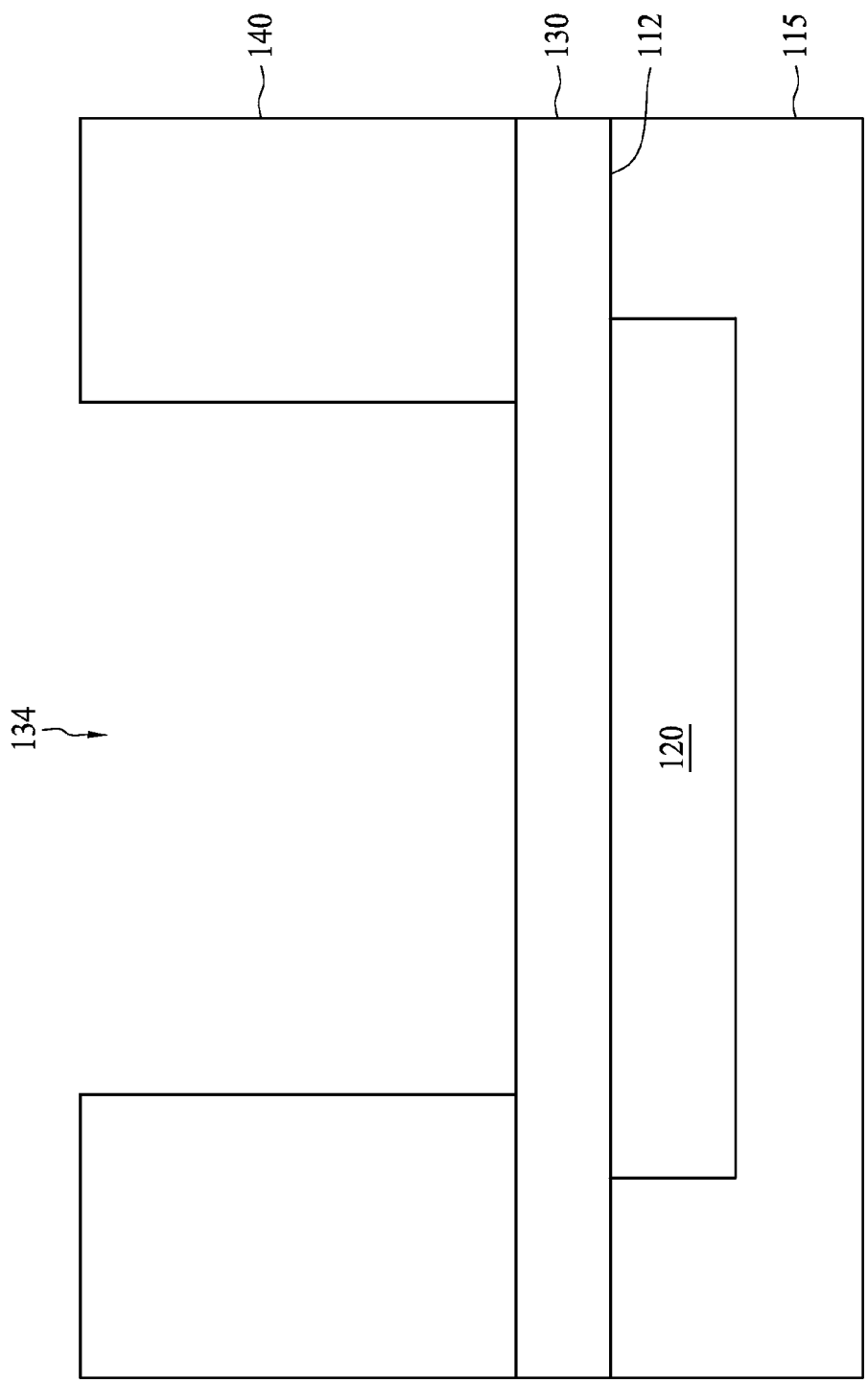
FIGS. 2A-2G represent a method of manufacturing a semiconductor package structure in accordance with some embodiments of the present disclosure.

Referring to FIG. 2A, a semiconductor substrate 115 having a conductive pad 120 is provided. The semiconductor substrate 115 includes circuitry (not shown), which is coupled with the conductive pad 120. The conductive pad 120 provides electrical connections between the circuitry of the semiconductor substrate 115 and external devices of another substrate. The conductive pad 120 is also served as a terminal or an input/output port of the circuitry. Suitable materials for the conductive pad 120 include, for example, copper (Cu), aluminum (Al), AlCu, copper alloy, or other mobile conductive materials. A dielectric layer 130 or a passivation layer is deposited on a surface 112 of the semiconductor substrate 115 by chemical vapor deposition (CVD). The dielectric layer 130 is made of dielectric material including, for example, oxide or nitride. The dielectric layer 130 also passivates the surface 112 to a non-active surface. In an embodiment, a polymeric layer (not shown) is deposited on the dielectric layer 130, wherein the polymeric layer is made of one or two suitable polymer materials such as epoxy, polyimide (PI), benzocyclobutene (BCB), polybenzoxazole (PBO), photo-sensitive polyimide material (PSPI), or soft organic materials. The polymeric layer provides a stress relief for the interconnecting regions during a thermal cycle or a stress testing.

A patterned photoresist 140 or a mask layer is formed over the semiconductor substrate 115, wherein the patterned photoresist 140 includes an opening 134 exposing a portion of the dielectric layer 130. The opening 134 has a predetermined width smaller than a width of the conductive pad 120.

Figure 2B:
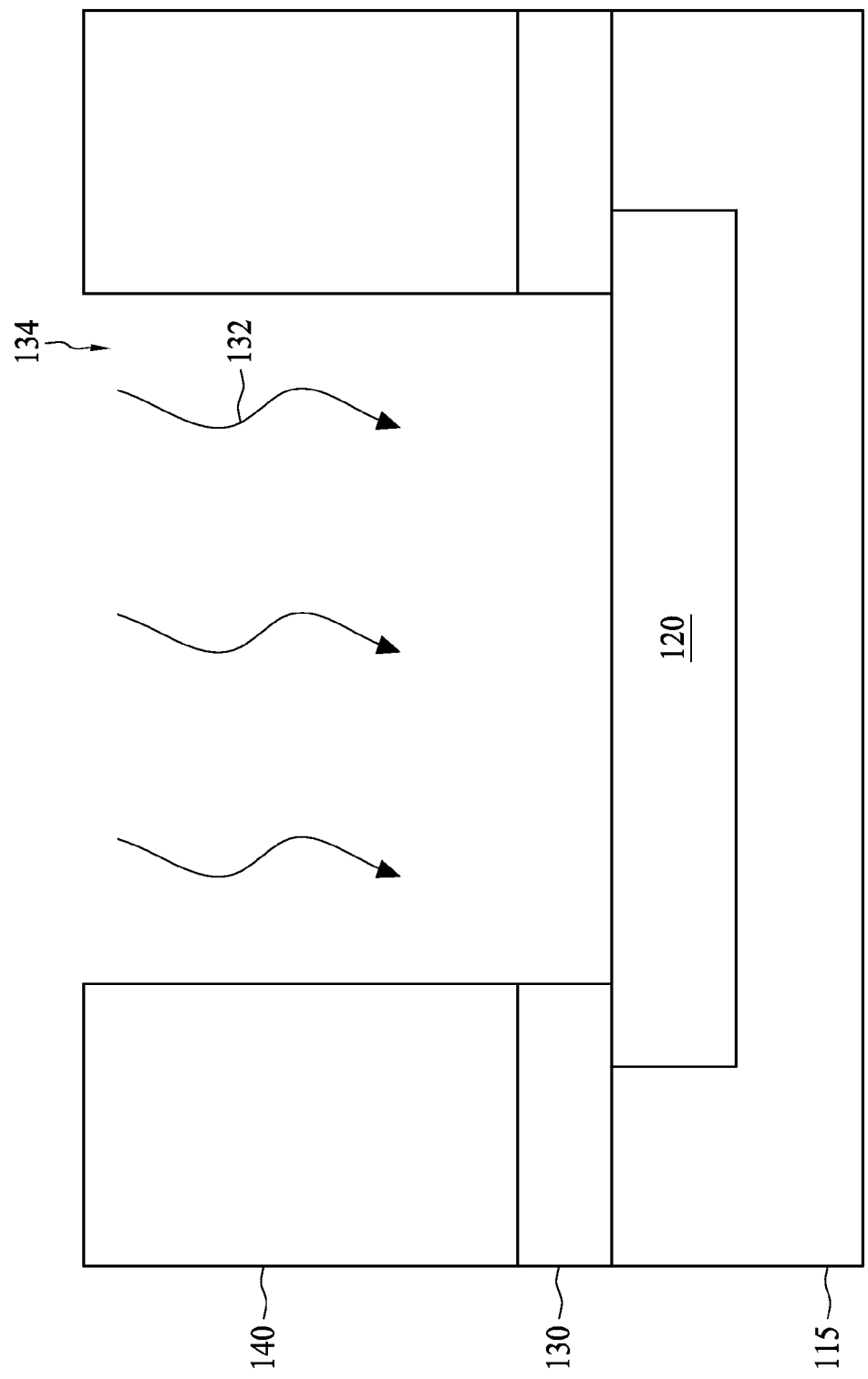

Referring to FIG. 2B, an etch process 132 is performed to etch the dielectric layer 130 through the opening 134, thus removing the exposes portion of the dielectric layer 130. The etch process 132 utilizes a wet etching or a dry etching with an anisotropy feature or an isotropy feature, for example, a reactive ion etch (RIE). The etch process 132 includes a chemistry molecule, which is ionized and react with materials of the dielectric layer 130, but not the patterned photoresist 140. Further, the etch process 132 includes a chemistry molecule such as $Cl_2$, $SF_6$, $N_2$, $CF_4$, $CHF_3$, $CH_2F_2$, $N_2H_2$, $O_2$, He or Ar.

Figure 2C:
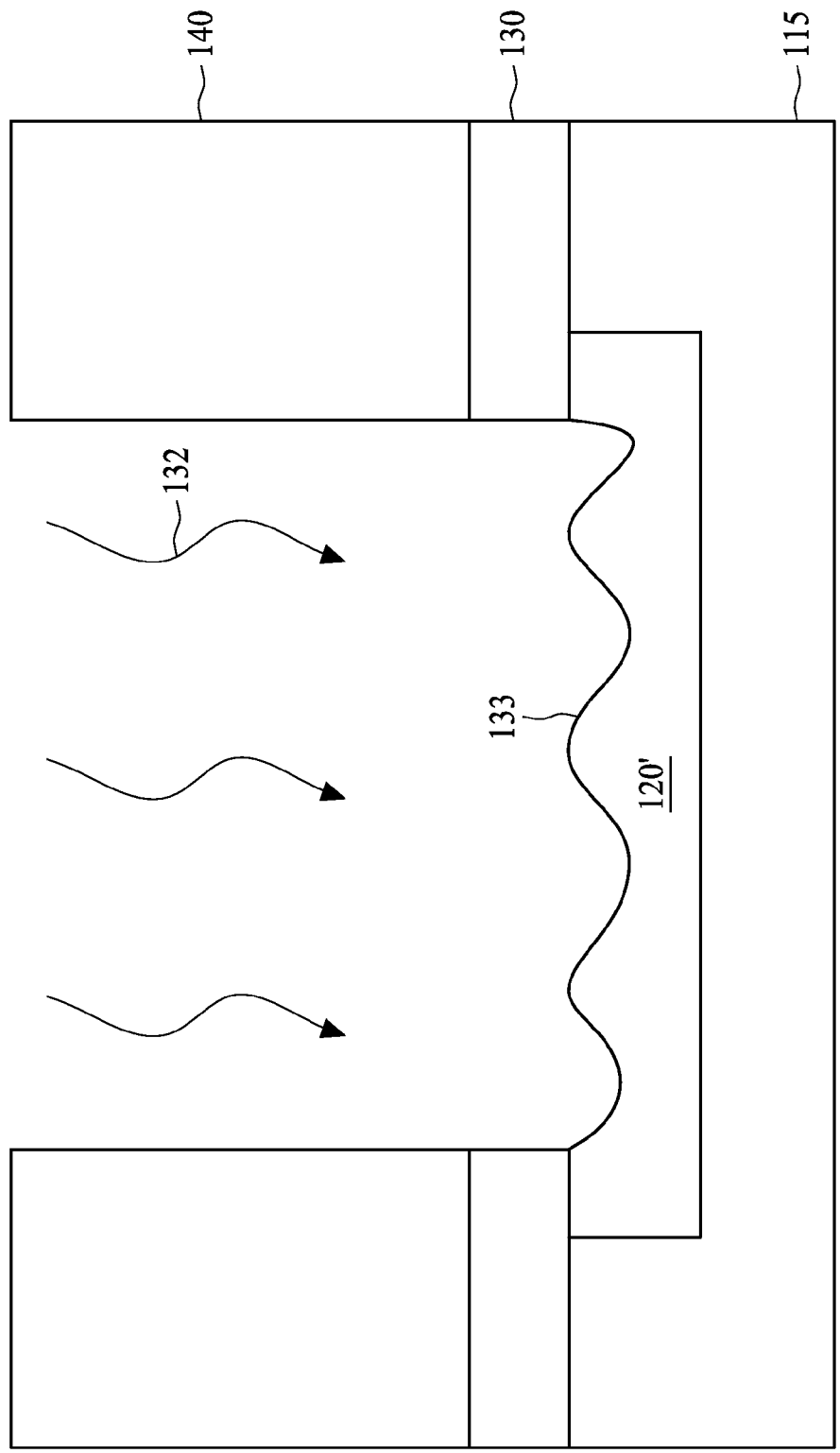

Referring to FIG. 2C, the etch process 132 is continued to overetch the conductive pad 120 even when an endpoint equipment detects signals of the material of the conductive pad 120. During the overetch, the etch process 132 utilizes a RF or DC bias power in order to bombard a surface of the conductive pad 120. As such, the conductive pad 120 is transformed into a conductive pad 120'. The conductive pad 120' includes a rough surface 133 with wavy curves or irregular pinholes. After the etch process 132 is terminated, the patterned photoresist 140 is stripped.

Figure 2D:
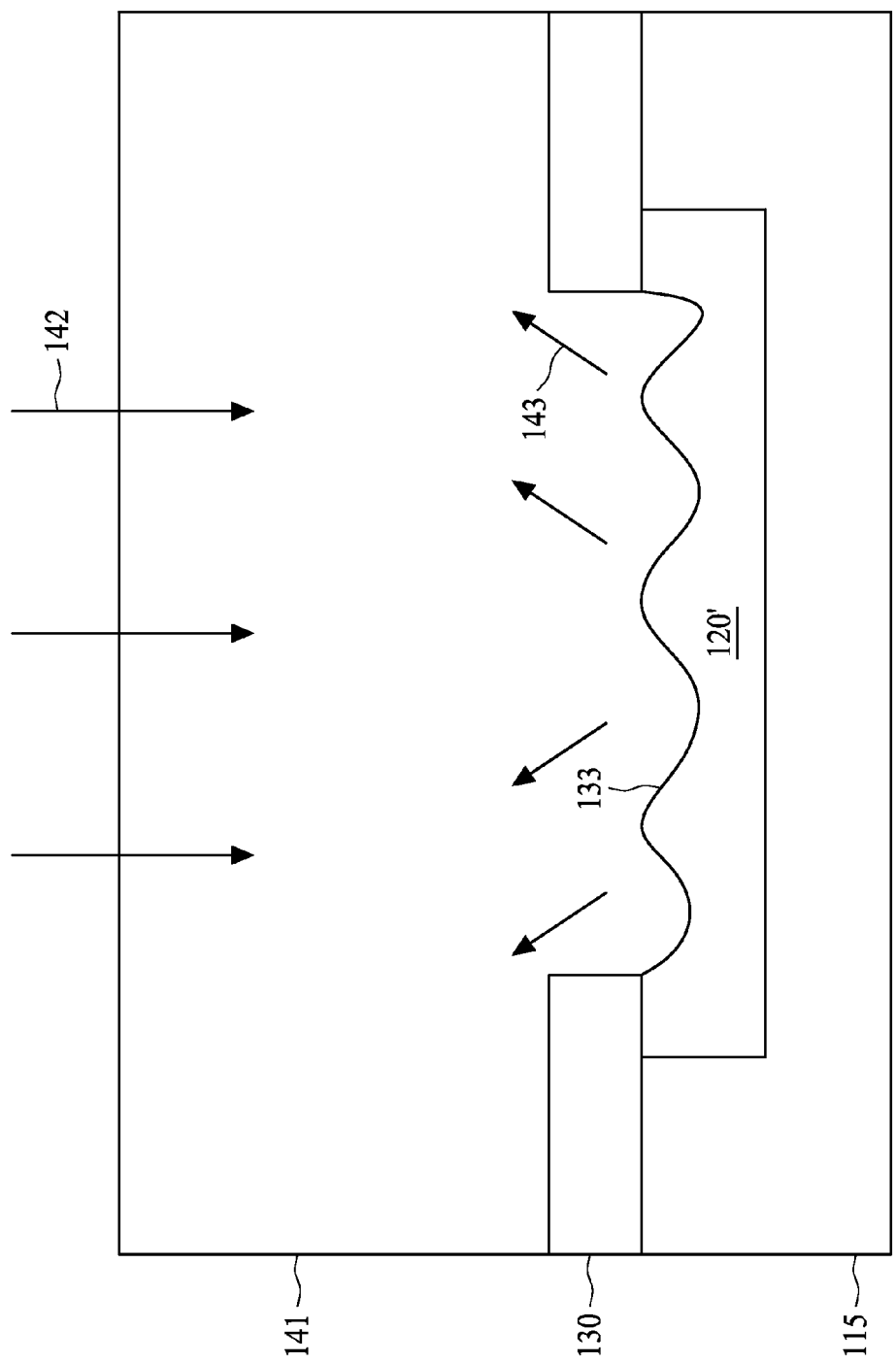

Referring to FIG. 2D, a photoresist 141 is deposited over the semiconductor substrate 115. The photoresist 141 is exposed under a light beam 142, wherein the light beam 142 includes a wave length, for example, within an ultraviolet region or a far ultraviolet region. The light beam 142 is emitted straight downwardly through a mask (not shown) and reflected by the conductive pad 120'. The mask directs the light beam 142 moving downwardly to a specific region, for example, the conductive pad 120'. Since the conductive pad 120' includes the rough surface 133, the light beam 142 penetrating through the photoresist 141 is then scattered by the rough surface 133. Light beams 141 represent the light beam 142 scattered from the conductive pad 120'. The light beams 143 are redirected laterally out of the specific region, thus causing a lateral exposure. Later, the photoresist 141 is immersed into a solution for developing.

Figure 2E:
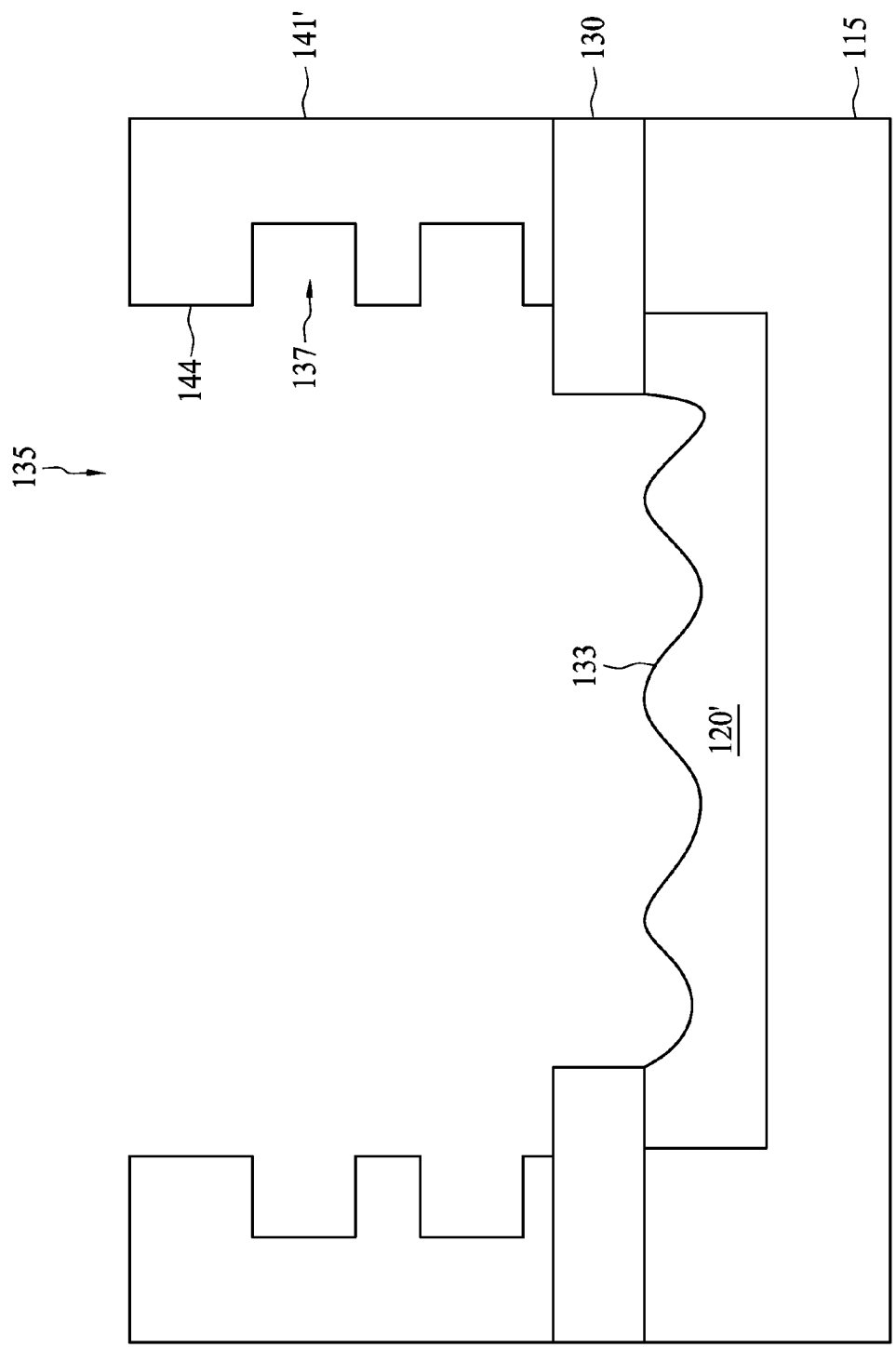

Referring to FIG. 2E, after the process of developing, the photoresist 141 is developed and transformed into a photoresist 141', which is a remaining portion of the photoresist 141. The photoresist 141' includes an opening 135 exposing the conductive pad 120', wherein the opening 135 has a width greater than a width of the conductive pad 120'. The lateral exposure by the light beams 143 causes sidewalls 144 of the photoresist 141' including a plurality of cavities 137. The cavities 137 are recessed as a rectangular shape, a sawtooth shape, a curved shape or irregular shapes. Further, the cavities 137 on both sidewalls 144 are asymmetrical as result of the irregular recesses of the rough surface 133. The quantity and positions of the cavities 137 depend on positions of the rough surface 133 of the conductive pad 120'.

Figure 2F:
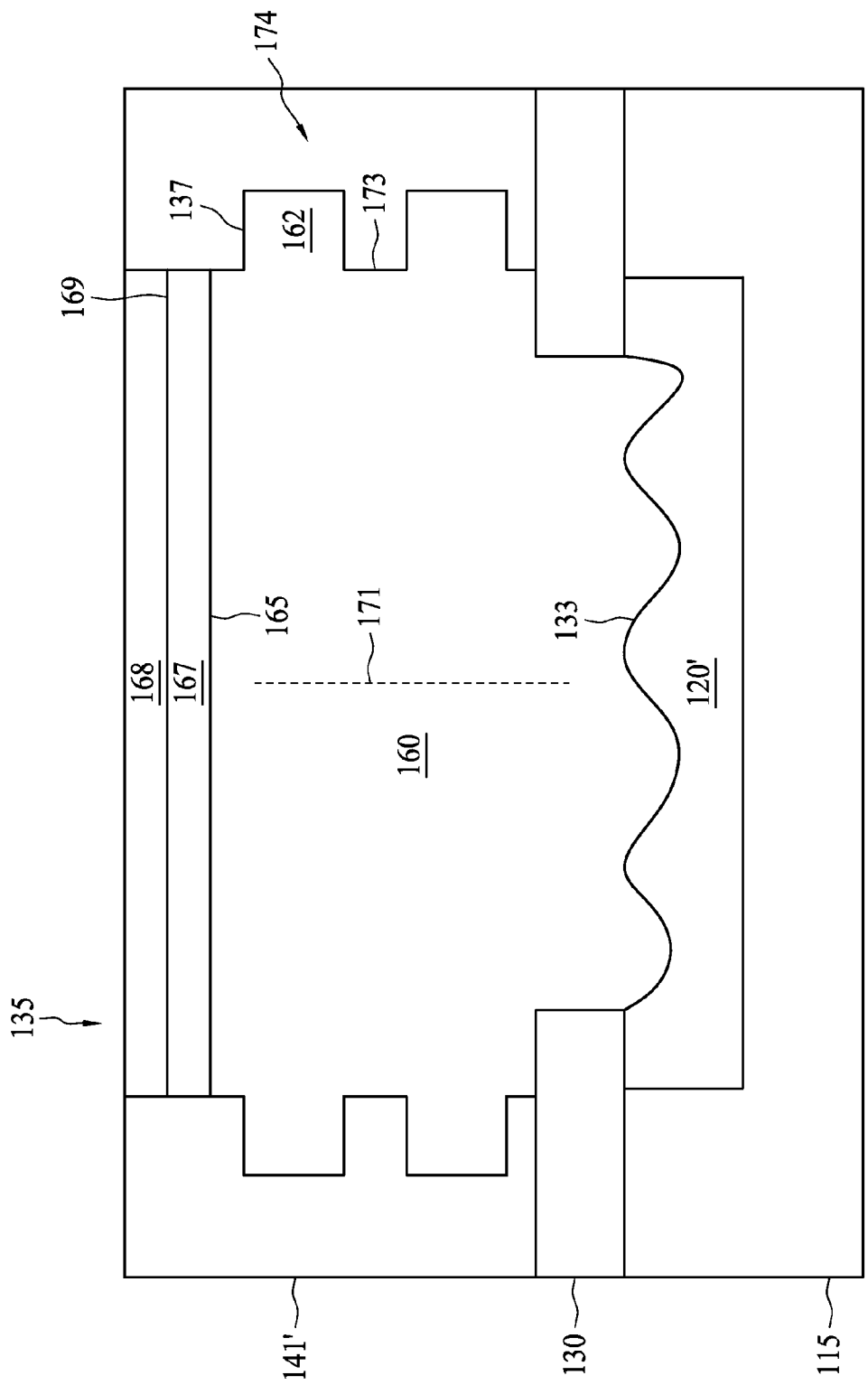

Referring to FIG. 2F, a conductive material is deposited in the opening 135 and the cavities 137 by evaporation, electroplating, or screen printing, thus forming a conductive pillar 160. The conductive material is drawn to the cavities 137 and forms a plurality of protruded portions 162. The protruded portions 162 are shaped by the formation of the cavities 137 in the photoresist 141'. Materials of the conductive material include, for example, pure copper, an alloy of copper or other suitable materials. The conductive pillar 160 contacts with the conductive pad 120', wherein the conductive pillar 160 interfaces with the rough surface 133. In an embodiment, an under bump metallization (UBM, not shown) is deposited on the conductive pad 120' prior to the deposition of the conductive pillar 160. The UBM provides a better adhesion between the conductive pillar 160 and the conductive pad 120' and serves as a diffusion barrier layer. The UBM is conformal to rough surface 133, thus forming a rough surface with a plurality of recesses facing the conductive pillar 160. Next, a cap layer 167 is formed on a top surface 165 of the conductive pillar 160 within the opening 135. The cap layer 167 acts as a barrier layer to prevent copper in the conductive pillar 160 from diffusing into bonding material, such as solder alloy, which is used to bond the semiconductor substrate 115 to external features. A solder layer 168 is formed on a top surface 169 of the cap layer 167 in the opening 135.

The conductive pillar 160 includes a sidewall 174 with a rough surface including a plurality of protruded portions 162 and a plurality of notches 173. The notches 173 are notching toward a longitudinal axis 171. The sidewall 174 has a roughness (Ra) greater than about 2 µm. In some embodiments, the sidewall 174 has a roughness (Ra) of about 1 µm to about 3 µm.

Figure 2G:
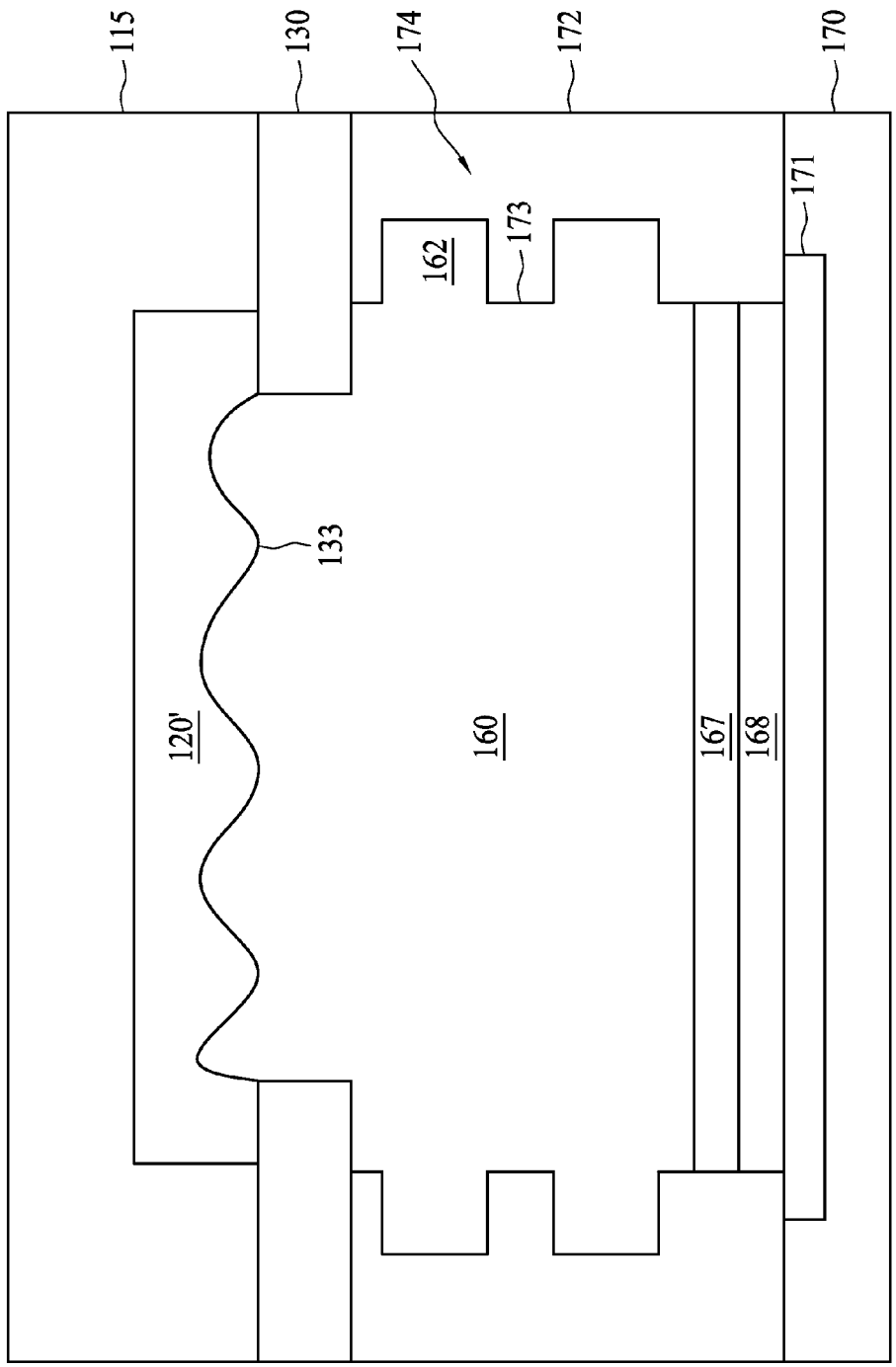

Referring to FIG. 2G, the photoresist 141' is stripped by a chemical solution or plasma ashing. The semiconductor substrate 115 is mounted on a semiconductor substrate 170 or a circuit board. During the mounting process with the semiconductor substrate 115, the semiconductor substrate 115 is flipped upside down and aligned with a conductive region 171 of the semiconductor substrate 170. The solder layer 168 is in contact with the conductive region 171. A reflow process is performed to soften the solder layer 168 for electrical connection and mechanical attachment between the conductive pillar 160 and the semiconductor substrate 170. After the conductive pillar 160 is connected to the semiconductor substrate 170, an underfill 172 is dispensed into gaps between the semiconductor substrates 115 and 170. The underfill 172 is dispensed along edges of the semiconductor substrate 115 by using syringes or needles and drawn into the notches 173 by capillary action. Further, the underfill 172 surrounds the conductive pillar 160 and then is cured. The underfill 172 provides a flexible compliant material surrounding the conductive pillar 160 and an adhesion between the semiconductor substrates 115 and 170.

By using the rough surface 133 of the conductive pad 120' during exposure, the conductive pillar 160 is shaped to have the protruded portion 162 and the notches 173, which increase the degree of surface roughness of sidewalls 174 so that a contact area of the conductive pillar 160 and other materials is increased. The adhesion ability between the conductive pillar 160 and other materials, such as the underfill 172 or the dielectric layer 130, is enhanced so as to avoid splitting. Due to higher adhesion ability, the delamination or cracks from the interface between the conductive pillar 160 and other materials can be reduced or avoided during a stress testing or a thermal cycle.

FIGS. 3A-3F represent a method of manufacturing a semiconductor package structure in accordance with some embodiments of the present disclosure. Each figure represents a stage of the method in a cross-sectional perspective view.

Figure 3A:
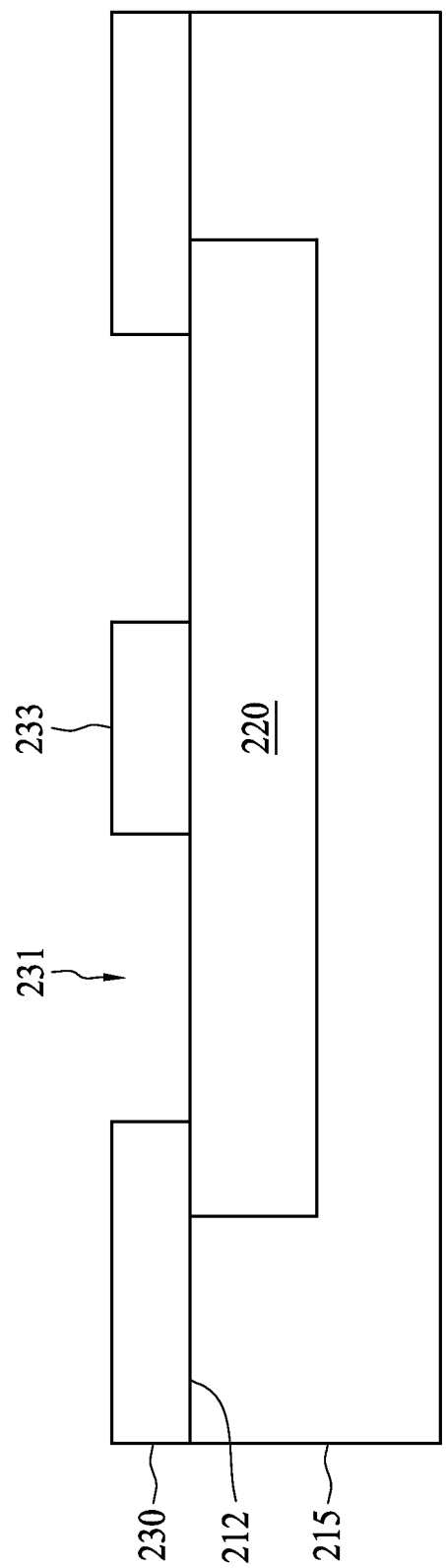
FIGS. 3A-3F represent a method of manufacturing a semiconductor package structure in accordance with some embodiments of the present disclosure.

Referring to FIG. 3A, a semiconductor substrate 215 having a conductive pad 220 is provided. The semiconductor substrate 215 includes circuitry (not shown), which is coupled with the conductive pad 220. A polymeric layer is deposited on a surface 212 of the semiconductor substrate 215 by coating. Lithography and etching are performed to remove a portion of the polymeric layer, thus remaining a patterned polymeric layer 230. The patterned polymeric layer 230 includes at least two openings 231 exposing a portion of the conductive pad 220. The openings 231 isolate at least one section 233, which is remained and located on the conductive pad 220. The section 233 covers a portion of the conductive pad 220 and includes a thickness elevated from the conductive pad 220. The patterned polymeric layer 230 is made of one or two suitable polymer materials such as epoxy, polyimide (PI), benzocyclobutene (BCB), polybenzoxazole (PBO), photosensitive polyimide material (PSPI), or soft organic materials.

Figure 3B:
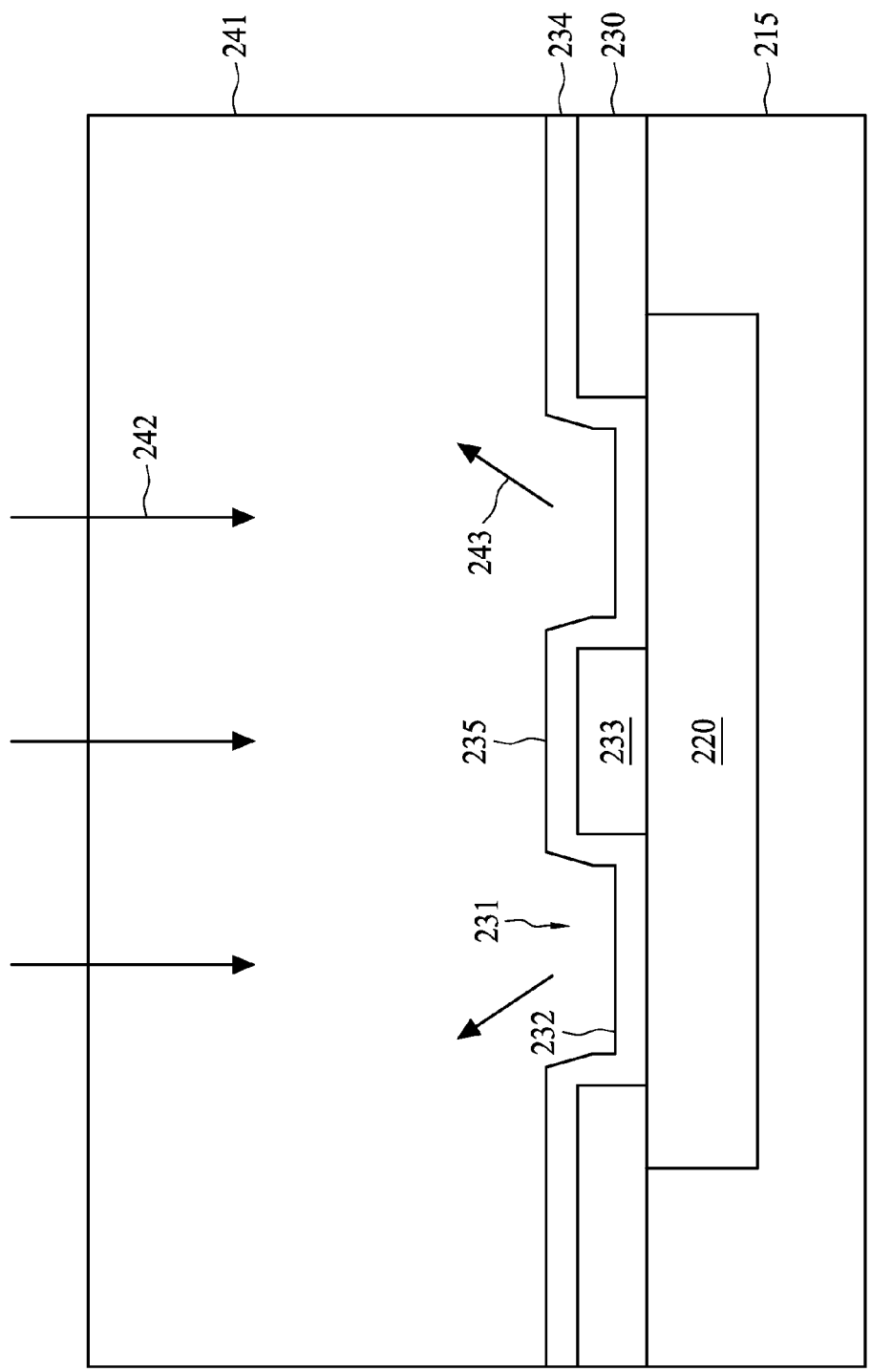

Referring to FIG. 3B, an under bump metallization (UBM) layer 234 is deposited on the section 233 and lining the openings 231, wherein the UBM layer 234 is also referred to as ball-limiting metallurgy (BLM). The UBM layer 234 interfaces the section 233 and connects to the conductive pad 220 through the openings 231. Since the UBM layer 234 is conformal to the section 233 and the openings 231, the UBM layer 234 thus obtains an uneven surface 235. The uneven surface 235 corresponds to the underlying section 233 and openings 231, thus resulting in a plurality of recesses 232 facing upward. The UBM layer 234 provides effective adhesion and a barrier between a following conductive pillar and the conductive pad 220. Materials of the UBM layer 234 include, for example, titanium (Ti), tantalum (Ta), titanium nitride (TiN), tantalum nitride (TaN), copper (Cu), copper alloys, nickel (Ni), tin (Sn), gold (Au), or combinations thereof. In an embodiment, the UBM layer 234 is made of a seed layer and a barrier layer by evaporation or an electroplating process.

A photoresist 241 is deposited over the semiconductor substrate 215. The photoresist 241 is exposed under a light beam 242, wherein the light beam 242 includes a wave length, for example, within an ultraviolet region or a far ultraviolet region. The light beam 242 is emitted straight downwardly through a mask (not shown) and reflected by the conductive pad 220. The mask directs the light beam 242 moving downwardly to a specific region, for example, the conductive pad 220. The light beam 242 penetrates through the photoresist 241 and is then scattered by the uneven surface 235. Light beams 243 represent the light beam 242 scattered from the conductive pad 220. The light beams 243 are redirected laterally out of the specific region, thus causing a lateral exposure. Later, the photoresist 241 is immersed into a solution for developing.

Figure 3C:
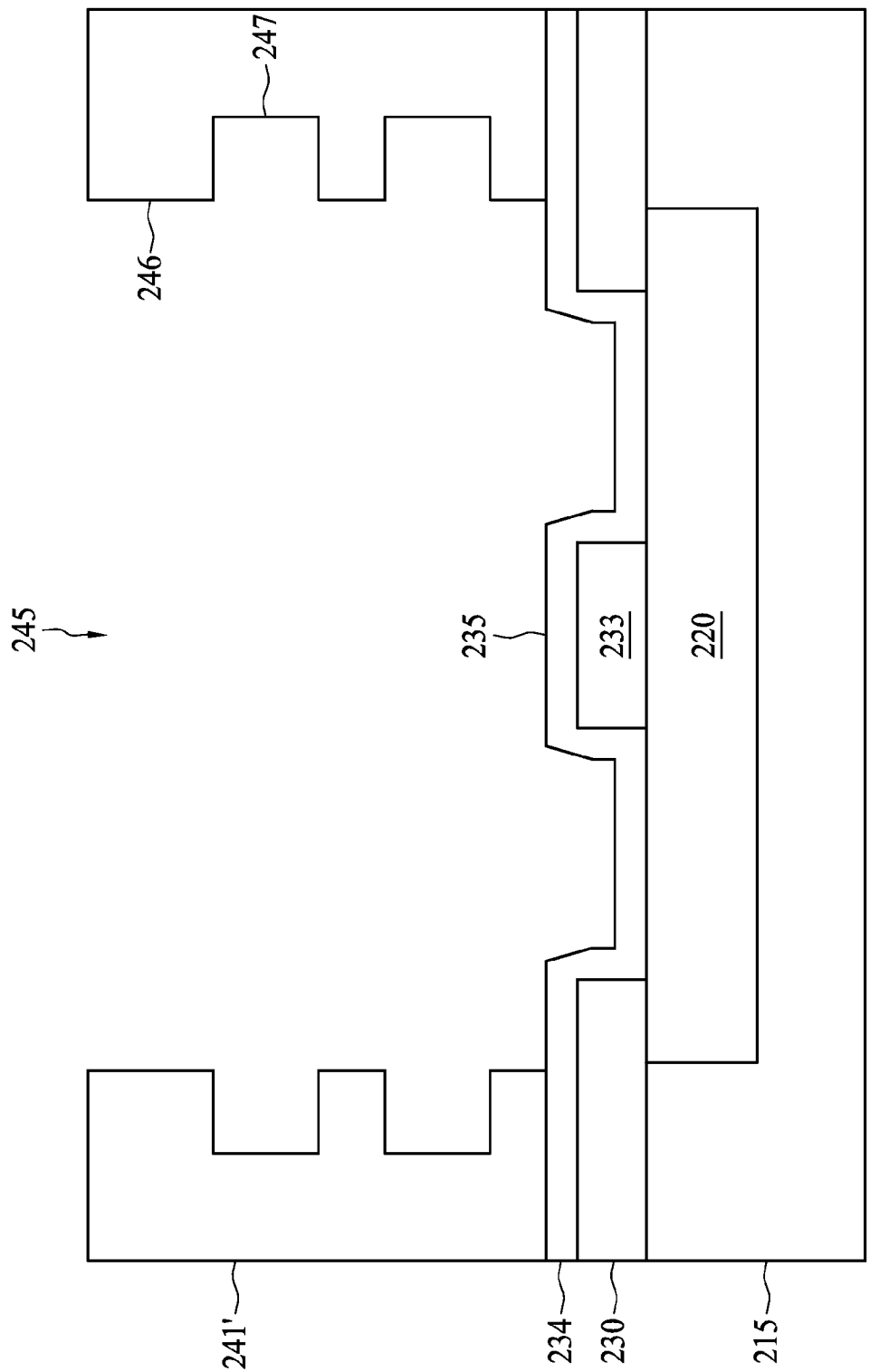

Referring to FIG. 3C, after the process of developing, the photoresist 241 is developed and transformed into a photoresist 241', which is a remaining portion of the photoresist 241. The photoresist 241' includes an opening 245 exposing a portion of the UBM layer 234, wherein the opening 245 is located above the conductive pad 220. The lateral exposure by the light beams 243 causes sidewalls 246 of the photoresist 241' including a plurality of cavities 247. The cavities 247 are recessed as a rectangular shape, a sawtooth shape, a curved shape or irregular shapes. The quantity and positions of the cavities 247 depend on the uneven surface 235.

Figure 3D:
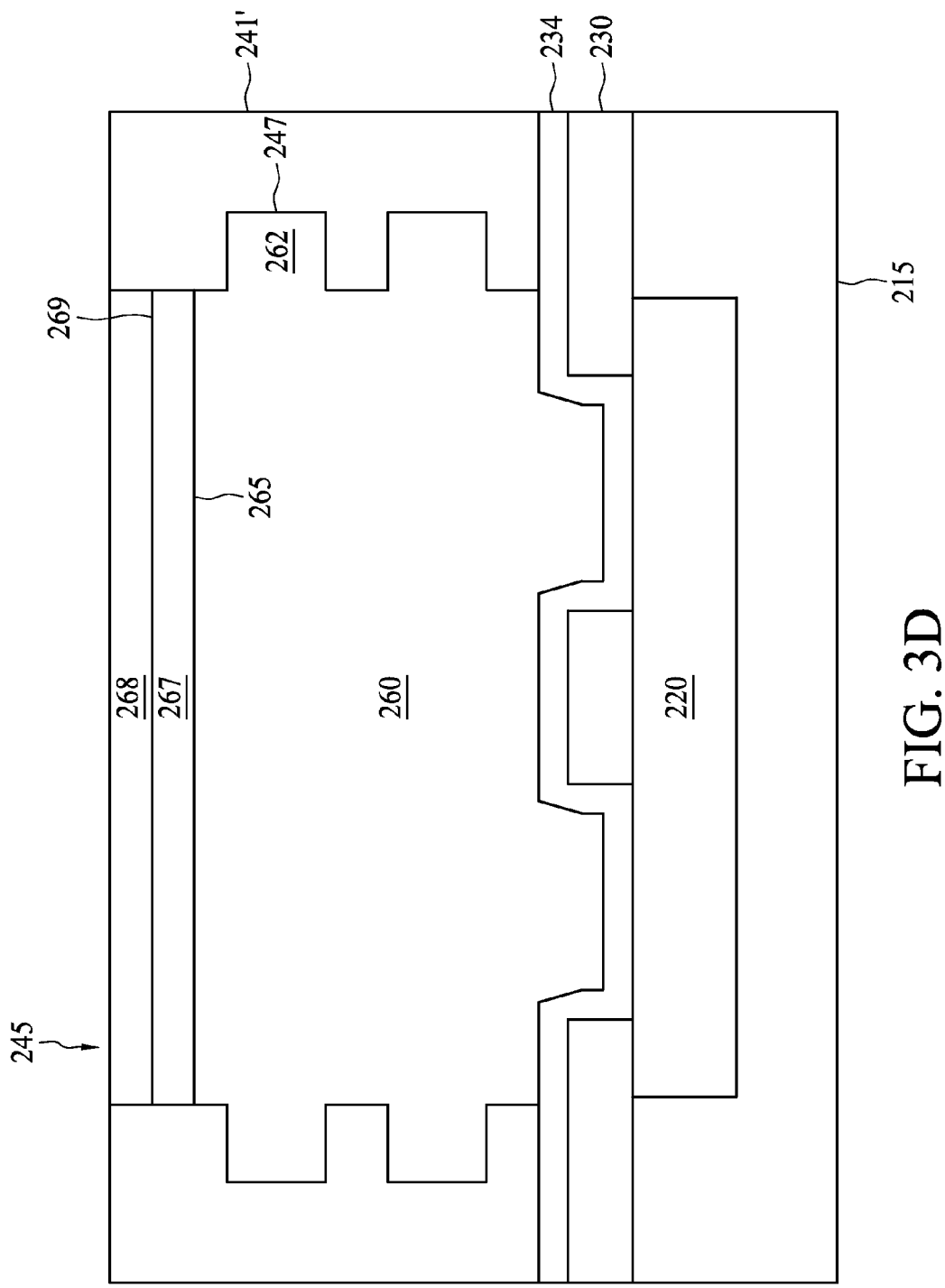

Referring to FIG. 3D, a conductive material is deposited in the opening 245 and the cavities 247 by evaporation, electroplating, or screen printing, thus forming a conductive pillar 260. The conductive material is drawn to fill the cavities 247 and forms a plurality of protruded portions 262. The protruded portions 262 are shaped by the profile of the cavities 247 in the photoresist 241'. The conductive pillar 260 is formed over the conductive pad 220, wherein the conductive pillar 260 interfaces with the UBM layer 234. As such, the conductive pillar 260 protrudes from the UBM layer 234. Next, a cap layer 267 is formed on a top surface 265 of the conductive pillar 260 within the opening 245. A solder layer 268 is formed on a top surface 269 of the cap layer 267 in the opening 245.

Figure 3E:
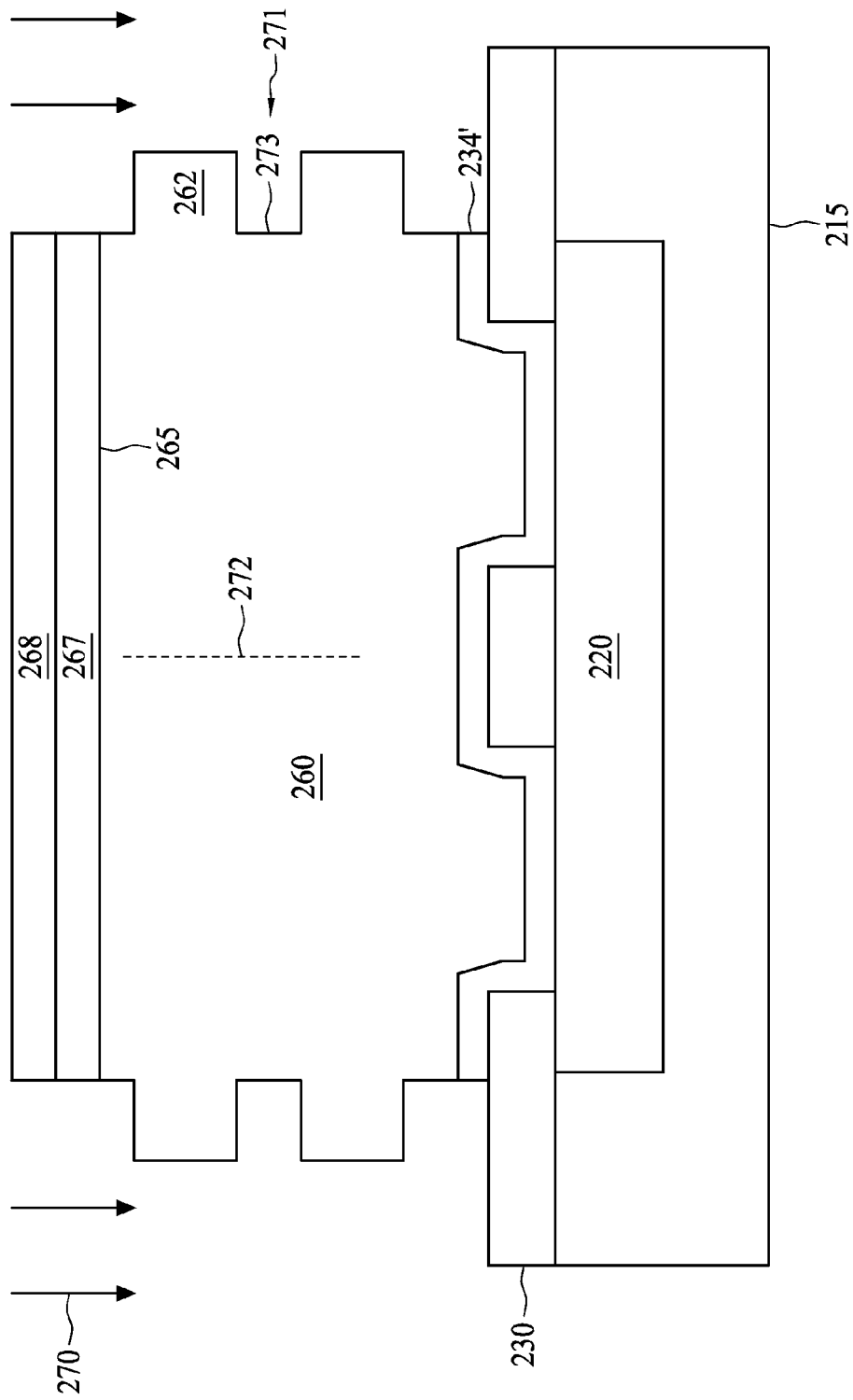

Referring to FIG. 3E, the photoresist 241' is stripped by a solution or plasma ashing. An etch process 270 is performed to remove an exposed portion of the UBM layer 234, thus remaining a UBM layer 234' under the conductive pillar 260. The etch process 270 utilizes a wet etching or a dry etching, for example, an acid solution with high selectivity. The conductive pillar 260 includes a sidewall 271 including a plurality of protruded portions 262 and a plurality of notches 273, thus increasing degree of surface roughness of the sidewall 271. The notches 273 are notching toward a longitudinal axis 272. The sidewall 271 has a roughness (Ra) greater than about 2 μm. In some embodiments, the sidewall 271 has a roughness (Ra) of about 1 μm to about 3 μm.

Figure 3F:
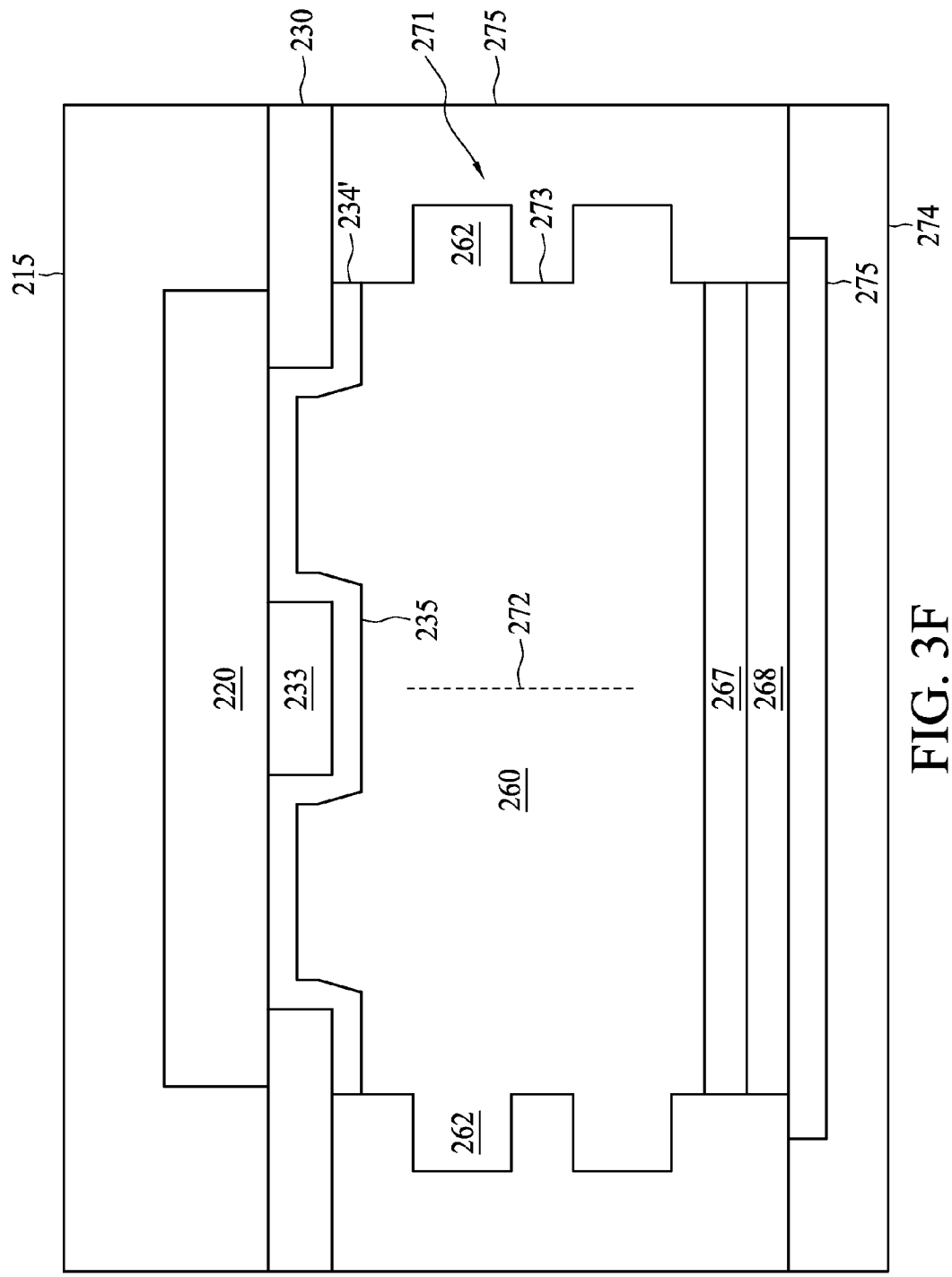

Referring to FIG. 3F, the semiconductor substrate 215 is mounted on a semiconductor substrate 274 or a circuit board. During the mounting process with the semiconductor substrate 215, the semiconductor substrate 215 is flipped upside down and aligned with a conductive region 275 of the semiconductor substrate 274. The solder layer 268 is in contact with the conductive region 275. A reflow process is performed to soften the solder layer 268 for electrical connection and mechanical attachment between the conductive pillar 260 and the semiconductor substrate 274. After the conductive pillar 260 is connected to the semiconductor substrate 274, an underfill 275 is dispensed into gaps between the semiconductor substrates 215 and 274, wherein the underfill 275 surrounds the conductive pillar 260 and fills up the notches 273.

By using the uneven surface 235 resulting from the section 233 during exposure, the conductive pillar 260 is shaped to have the protruded portions 262 and the notches 273, which increase the degree of surface roughness of sidewalls 271 so that a contact area of the conductive pillar 260 and other materials is increased. The adhesion ability between the conductive pillar 260 and other materials, such as the underfill 275 or the dielectric layer 230, is enhanced so as to avoid splitting. Due to higher adhesion ability, the delamination or cracks from the interface between the conductive pillar 260 and other materials can be reduced or avoided during a stress testing or a thermal cycle.

FIGS. 4A-4E represent a method of manufacturing a semiconductor package structure in accordance with some embodiments of the present disclosure. Each figure represents a stage of the method in a cross-sectional perspective view.

Figure 4A:
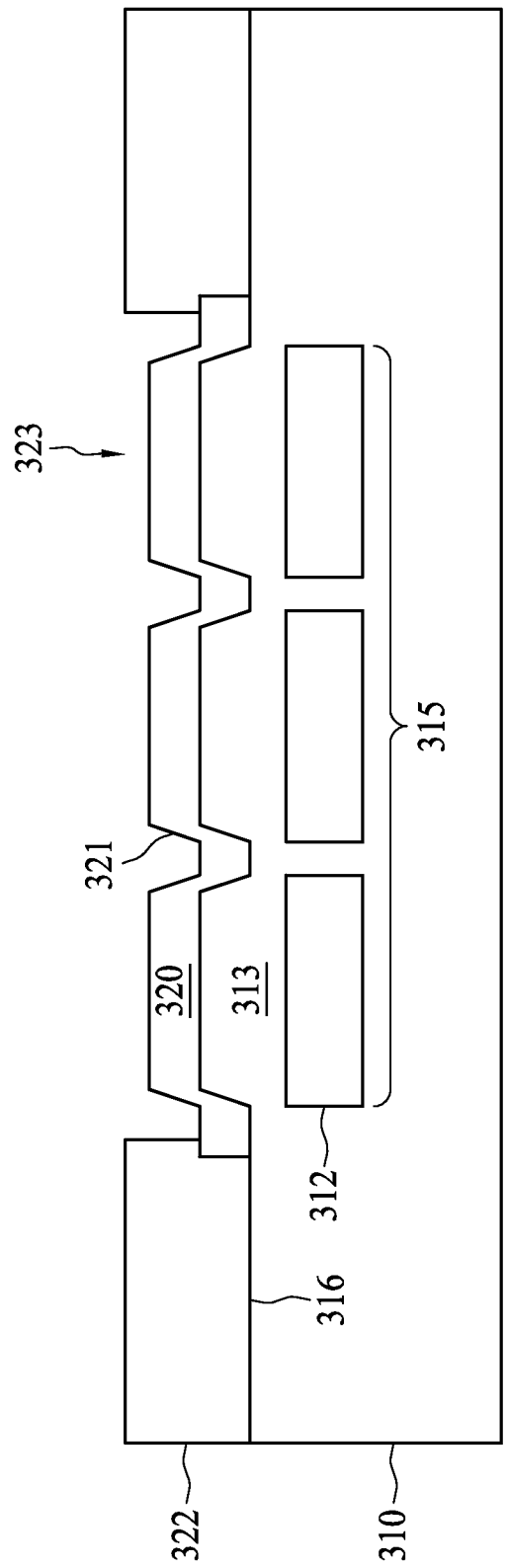

Referring to FIG. 4A, a semiconductor substrate 310 having a conductive pad 320 is provided. The semiconductor substrate 310 further includes multilayer interconnects (MLIs) 312, interlayer (or inter-level) dielectric (ILD) layers 313 and circuitry (not shown), which is coupled with the conductive pad 320. The MLIs 312 are disposed in the ILD layers 313, wherein the ILD layers 313 separate and isolate the MLIs 312 from other wirings. The MLIs 312 are coupled with the circuitry and integrated as a conductive route 315 underneath the conductive pad 320. Since the conductive route 315 has a thickness, the ILD layers 313 are conformal to the thickness and form an uneven surface with protrusions and cavities. The conductive pad 320 is conformal to an uneven surface resulting from the conductive route 315, thus forming an uneven surface 321. The uneven surface 321 also includes protrusions and cavities corresponding to the ILD layers 313. Materials of the MLIs 312 include conductive materials, such as aluminum, aluminum/silicon/copper alloy, titanium, titanium nitride, tungsten, polysilicon, metal silicide, or combinations thereof. Materials of the ILD layers 313 include silicon dioxide, silicon nitride, silicon oxynitride, TEOS oxide, phosphosilicate glass (PSG), borophosphosilicate glass (BPSG), fluorinated silica glass (FSG), polyimide, other suitable materials, or combinations thereof. A patterned dielectric layer 322 or a passivation layer is deposited on a surface 316 of the semiconductor substrate 310. The patterned dielectric layer 322 includes an opening 323 exposing a portion of the conductive pad 320.

Figure 4B:
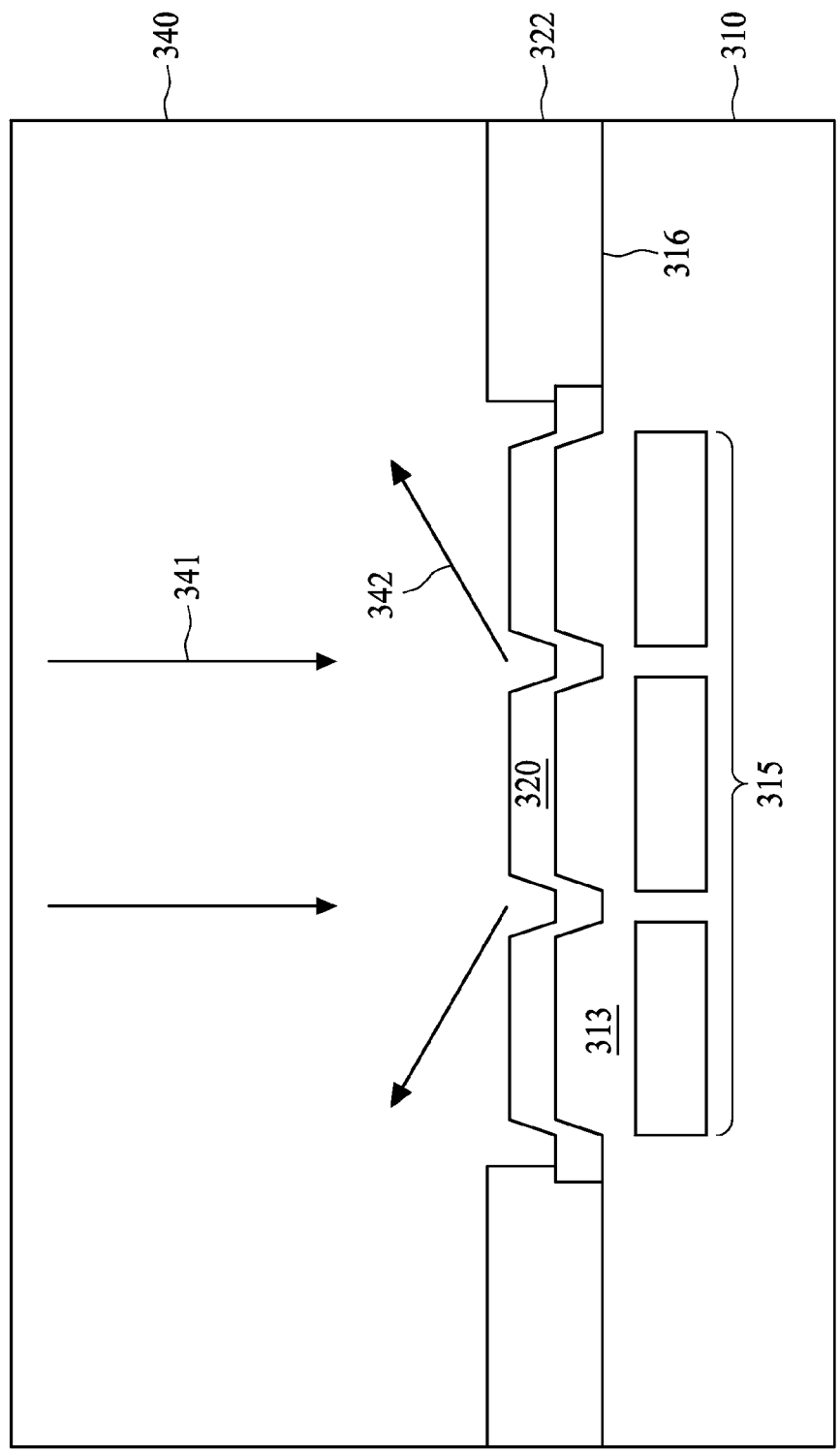

Referring to FIG. 4B, a photoresist 340 is deposited over the semiconductor substrate 310. The photoresist 340 is exposed under a light beam 341, wherein the light beam 341 includes a wave length, for example, within an ultraviolet region or a far ultraviolet region. The light beam 341 is emitted straight downwardly through a mask (not shown) and reflected by the conductive pad 320. Since the conductive pad 320 includes the uneven surface 321, the light beam 341 penetrates through the photoresist 340 and is then scattered by the uneven surface 321. Light beams 341 represent the light beam 342 scattered from the conductive pad 320. The light beams 342 are redirected laterally out of the specific region such as the conductive pad 320, thus causing a lateral exposure. Later, the photoresist 340 is immersed into a solution for developing.

Figure 4C:
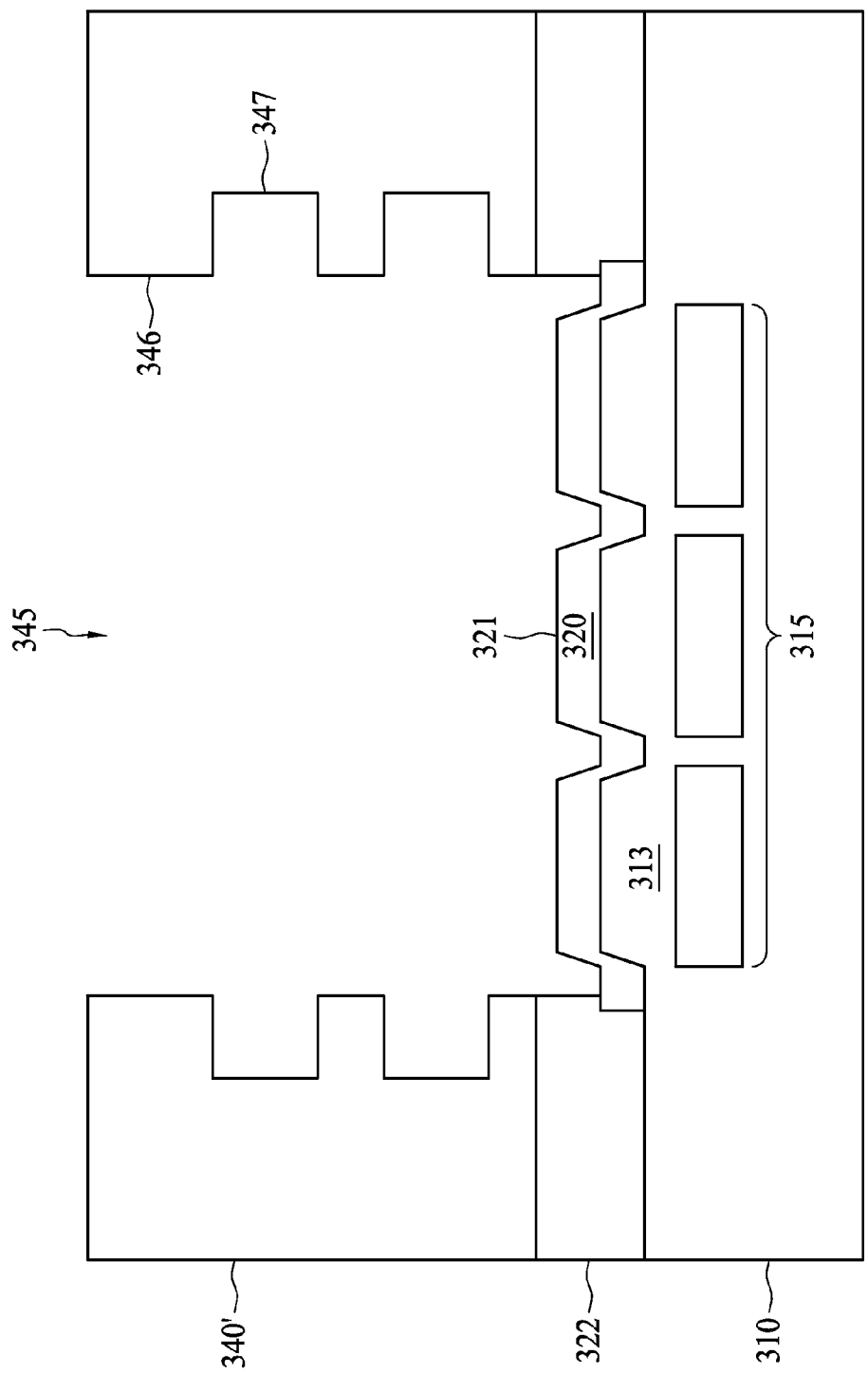

Referring to FIG. 4C, after the process of developing, the photoresist 340 is developed and transformed into a photoresist 340', which is a remaining portion of the photoresist 340. The photoresist 340' includes an opening 345 exposing a portion of the conductive pad 320. The lateral exposure by the light beams 342 causes sidewalls 346 of the photoresist 340' including a plurality of cavities 347. The cavities 347 are recessed as a rectangular shape, a sawtooth shape, a curved shape or irregular shapes. The quantity and positions of the cavities 347 depend on the uneven surface 321.

Figure 4D:
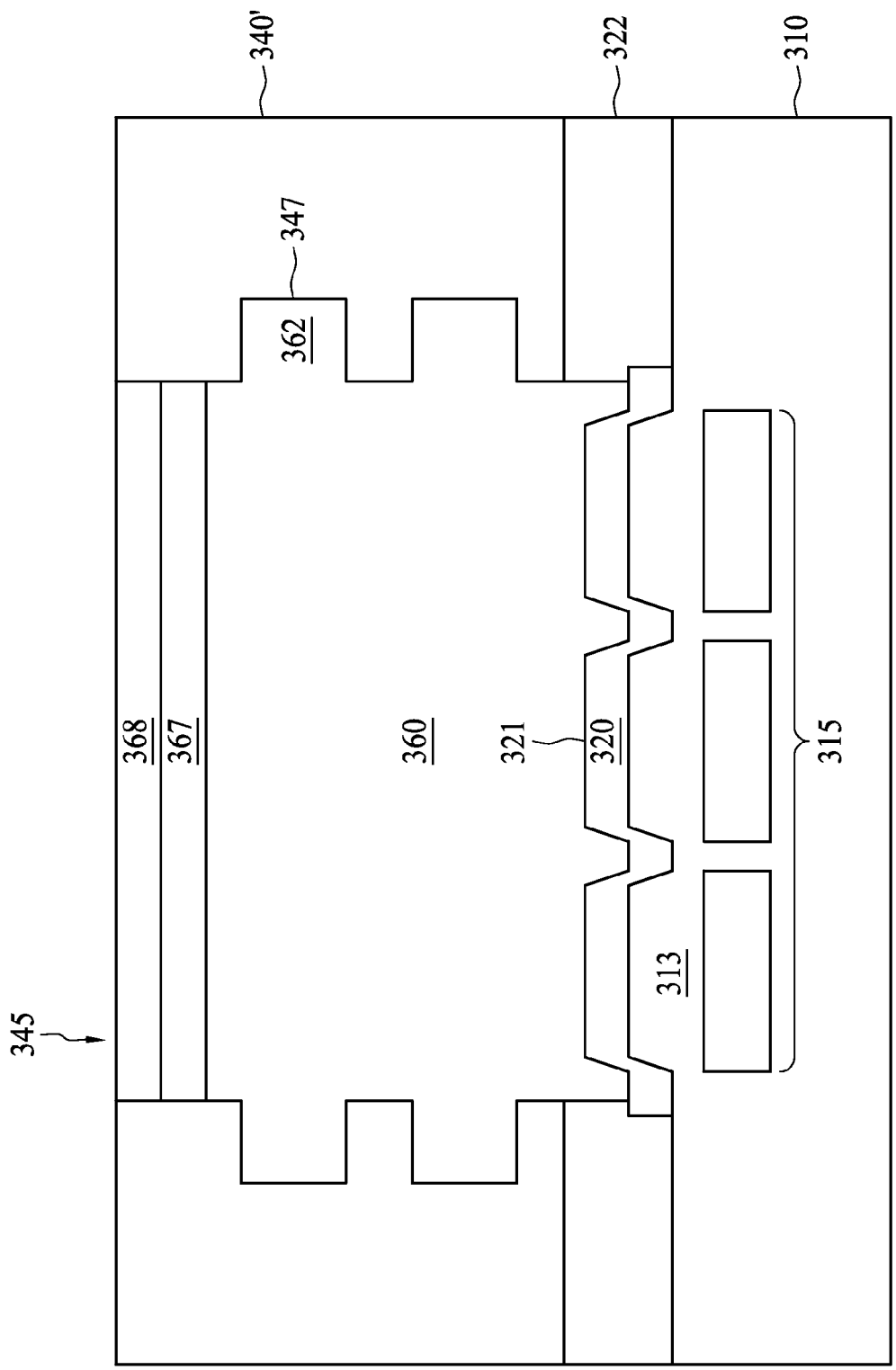

Referring to FIG. 4D, a conductive material is deposited in the opening 345 and the cavities 347 by evaporation, electroplating, or screen printing, thus forming a conductive pillar 360. The conductive material is drawn to fill the cavities 347 and forms a plurality of protruded portions 362. The protruded portions 362 are shaped by the profile of the cavities 347 in the photoresist 340'. The conductive pillar 360 is formed over the conductive pad 320, wherein the conductive pillar 360 interfaces with the uneven surface 321. As such, the conductive pillar 360 protrudes from the conductive pad 320. Next, a cap layer 367 is formed on the conductive pillar 360 within the opening 345. A solder layer 368 is formed on the cap layer 367 in the opening 345.

Referring to FIG. 4E, the semiconductor substrate 310 is mounted on a semiconductor substrate 350 or a circuit board. During the mounting process with the semiconductor substrate 350, the semiconductor substrate 310 is flipped upside down and aligned with a conductive region 352 of the semiconductor substrate 350. The solder layer 368 is in contact with the conductive region 352. A reflow process is performed to soften the solder layer 368 for electrical connection and mechanical attachment between the conductive pillar 360 and the semiconductor substrate 350. After the conductive pillar 360 is connected to the semiconductor substrate 350, an underfill 375 is dispensed into gaps between the semiconductor substrates 310 and 350, wherein the underfill 375 surrounds the conductive pillar 360.

The conductive pillar 360 includes a sidewall 371 with a rough surface including a plurality of protruded portions 362 and notches 373, thus increasing degree of surface roughness of the sidewall 371. The notches 373 are notching toward a longitudinal axis 372. The sidewall 371 has a roughness (Ra) greater than about 2 µm. In some embodiments, the sidewall 371 has a roughness (Ra) of about 1 µm to about 3 µm. By using the uneven surface 321 resulting from the conductive route 315 during exposure, the conductive pillar 360 is shaped to have the protruded portions 362 and the notches 373, which increase a contact area of the conductive pillar 360 and other materials. The adhesion ability between the conductive pillar 360 and other materials, such as the underfill 375 or the dielectric layer 322, is enhanced so as to avoid splitting. Due to higher adhesion ability, the delamination or cracks from the interface between the conductive pillar 360 and other materials can be reduced or avoided during a stress testing or a thermal cycle.

FIGS. 5A-5F represent a method of manufacturing a semiconductor package structure in accordance with some embodiments of the present disclosure. Each figure represents a stage of the method in a cross-sectional perspective view.

Figure 5A:
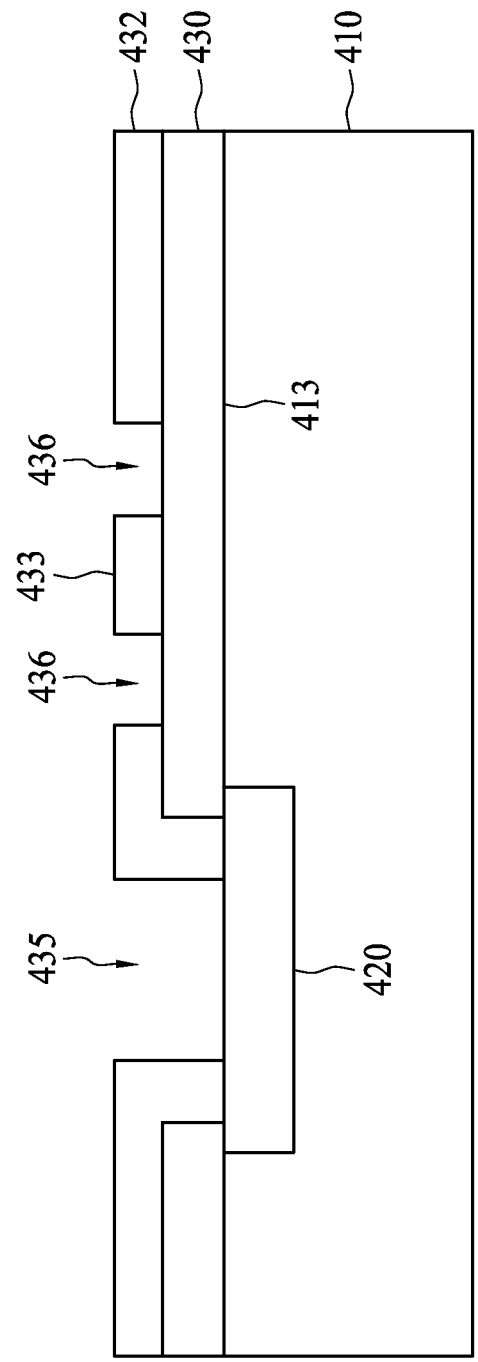
FIGS. 5A-5F represent a method of manufacturing a semiconductor package structure in accordance with some embodiments of the present disclosure.

Referring to FIG. 5A, a semiconductor substrate 410 having a conductive pad 420 is provided. The conductive pad 420 is exposed on a surface 413 of the semiconductor substrate 410 and faces upward. The semiconductor substrate 410 further includes circuitry (not shown), which is coupled with the conductive pad 420. A dielectric layer or a passivation layer is deposited on the surface 413 and then patterned to form a passivation layer 430. The passivation layer 430 covers the surface 413 and exposes a portion of the conductive pad 420. A polymeric layer is deposited over the semiconductor substrate 410 and then patterned to form a polymeric layer 432. The polymeric layer 432 includes an opening 435 and openings 436, wherein the opening 435 exposes a portion of the conductive pad 420. The opening 435 includes a width smaller than that of the conductive pad 420. The openings 436 expose portions of the passivation layer 430. The openings 436 isolate parts of the polymeric layer 432, for example, a section 433. The section 433 is isolated and elevated from the passivation layer 430. Further, the openings 436 are formed on a predetermined position below a following conductive pillar.

Figure 5B:
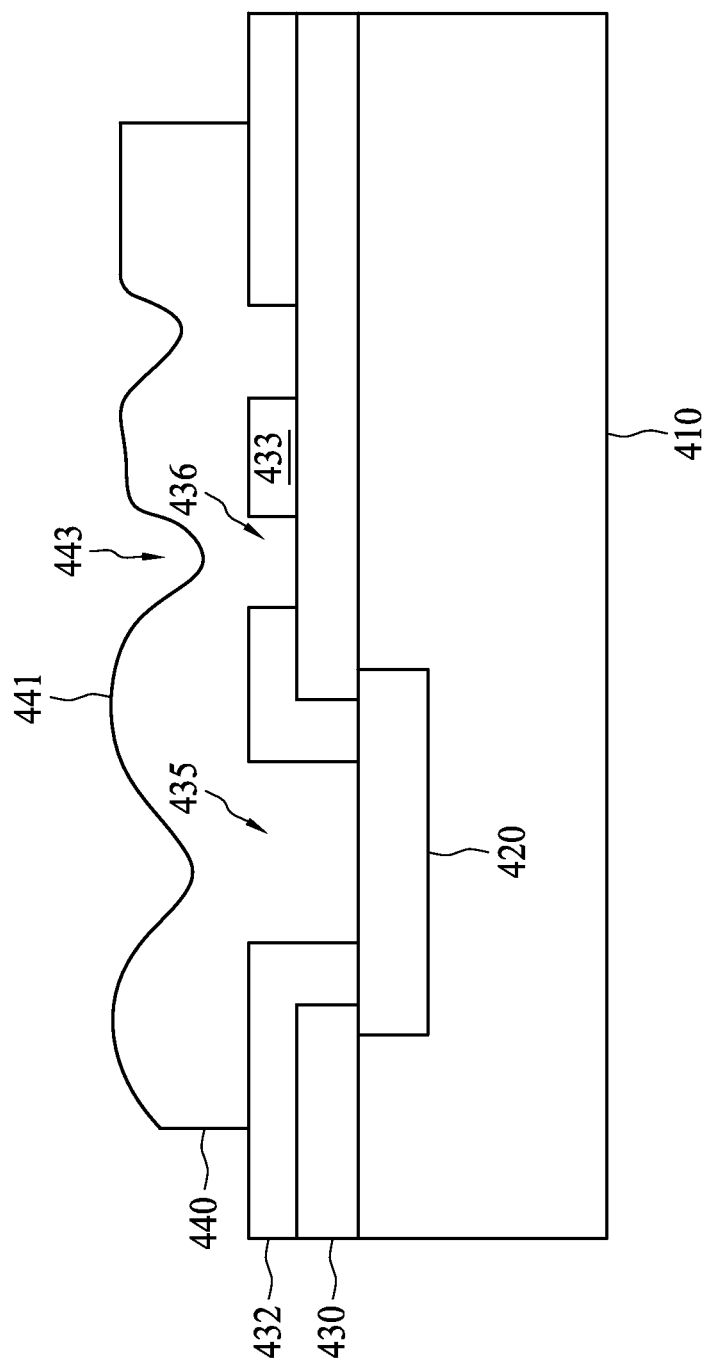

Referring to FIG. 5B, a post passivation interconnects (PPI) layer is deposited over the semiconductor substrate 410 and then patterned to form a PPI layer 440. The PPI layer 440 fills up the opening 435 and openings 436 and extends on the polymeric layer 432 with a specific wiring pattern. Further, the PPI layer 440 connects to the conductive pad 420 through the opening 435 and contacts the portions of the passivation layer 430 through the openings 436. Due to uneven underlying layers such as the section 433 and the openings 436, the PPI layer 440 is conformal to the uneven layers so as to form an uneven surface 441. The uneven surface 441 includes a higher degree of surface fluctuation above the section 433 and the openings 436. The uneven surface 441 includes irregular potholes 443 above positions of the openings 436. The PPI layer 440 functions as power lines, re-distribution lines (RDL), interconnectors, inductors, capacitors or any passive components. Materials of the PPI layer 440 include, for example, copper, aluminum, copper alloy, aluminum alloy, or other suitable conductive materials. The PPI layer 440 is formed by electrochemical plating, electroless plating, sputtering, chemical vapor deposition, and the like.

Figure 5C:
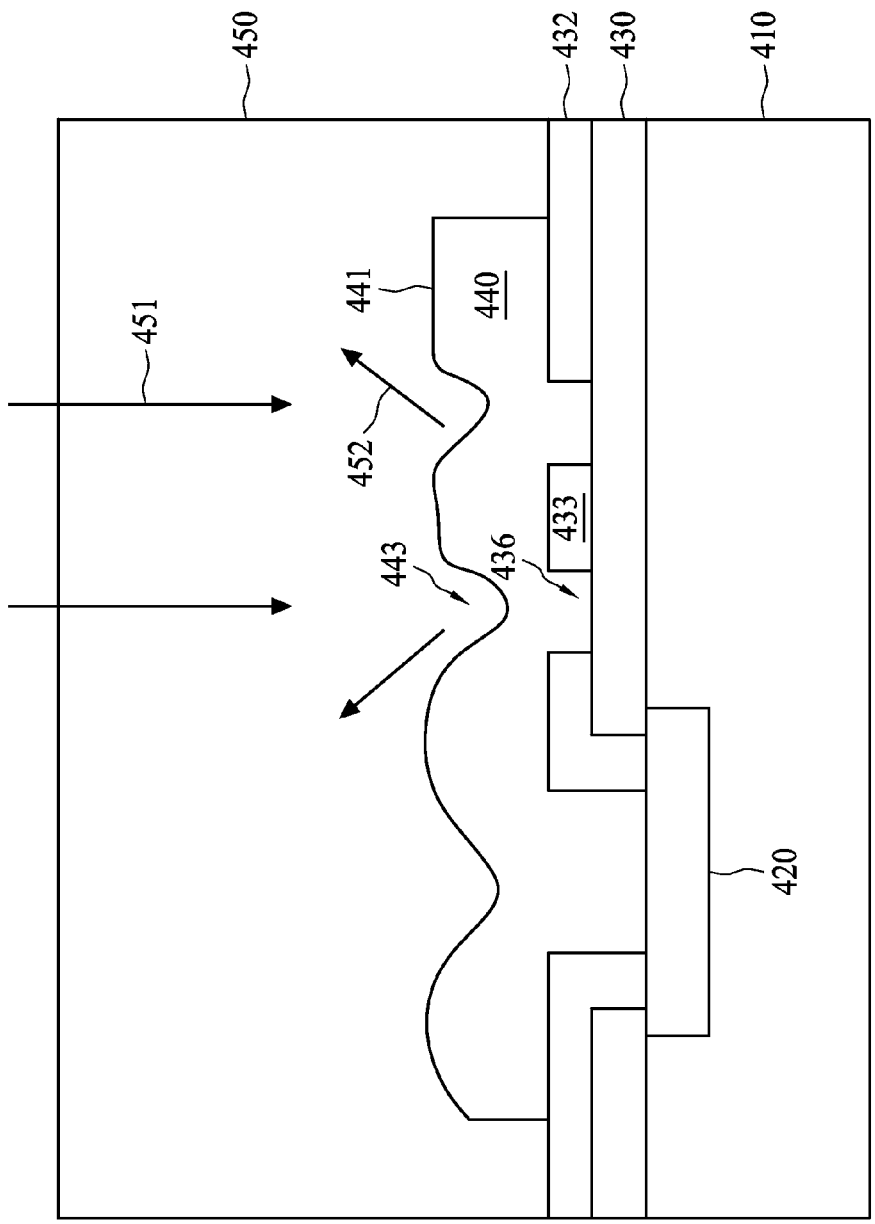

Referring to FIG. 5C, a photoresist 450 is deposited over the semiconductor substrate 410. The photoresist 450 is exposed under a light beam 451, wherein the light beam 451 includes a wave length, for example, within an ultraviolet region or a far ultraviolet region. The light beam 451 is emitted straight downwardly through a mask (not shown) and reflected by the PPI layer 440. The light beam 451 penetrates through the photoresist 450 and is then scattered by the uneven surface 441. Light beams 452 represent the light beam 451 scattered from the PPI layer 440. For example, a straight light beam 451 is scattered by the irregular potholes 443 and is redirected laterally out of the PPI layer 440, thus causing a lateral exposure. Later, the photoresist 450 is immersed into a solution for developing.

Figure 5D:
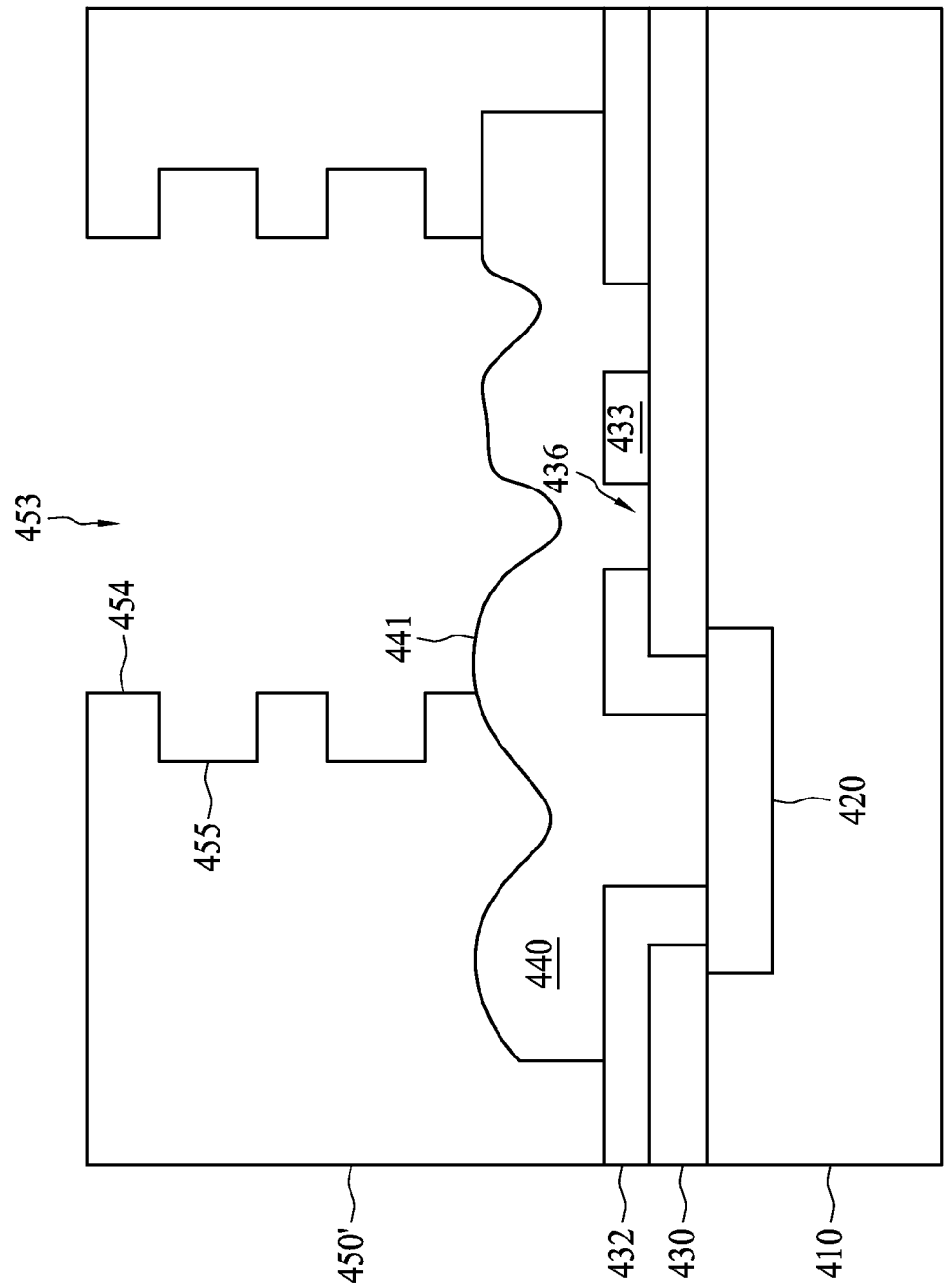

Referring to FIG. 5D, after the process of developing, the photoresist 450 is developed and transformed into a photoresist 450', which is a remaining portion of the photoresist 450. The photoresist 450' includes an opening 453 exposing the PPI layer 440, wherein the opening 453 is located above the section 433 and the openings 436. The lateral exposure by the light beams 452 causes sidewalls 454 of the photoresist 450' including a plurality of cavities 455. The cavities 455 are recessed as a rectangular shape, a sawtooth shape or a curved shape. The quantity and positions of the cavities 455 on both sidewalls 454 are asymmetrical and depend on the uneven surface 441.

Figure 5E:
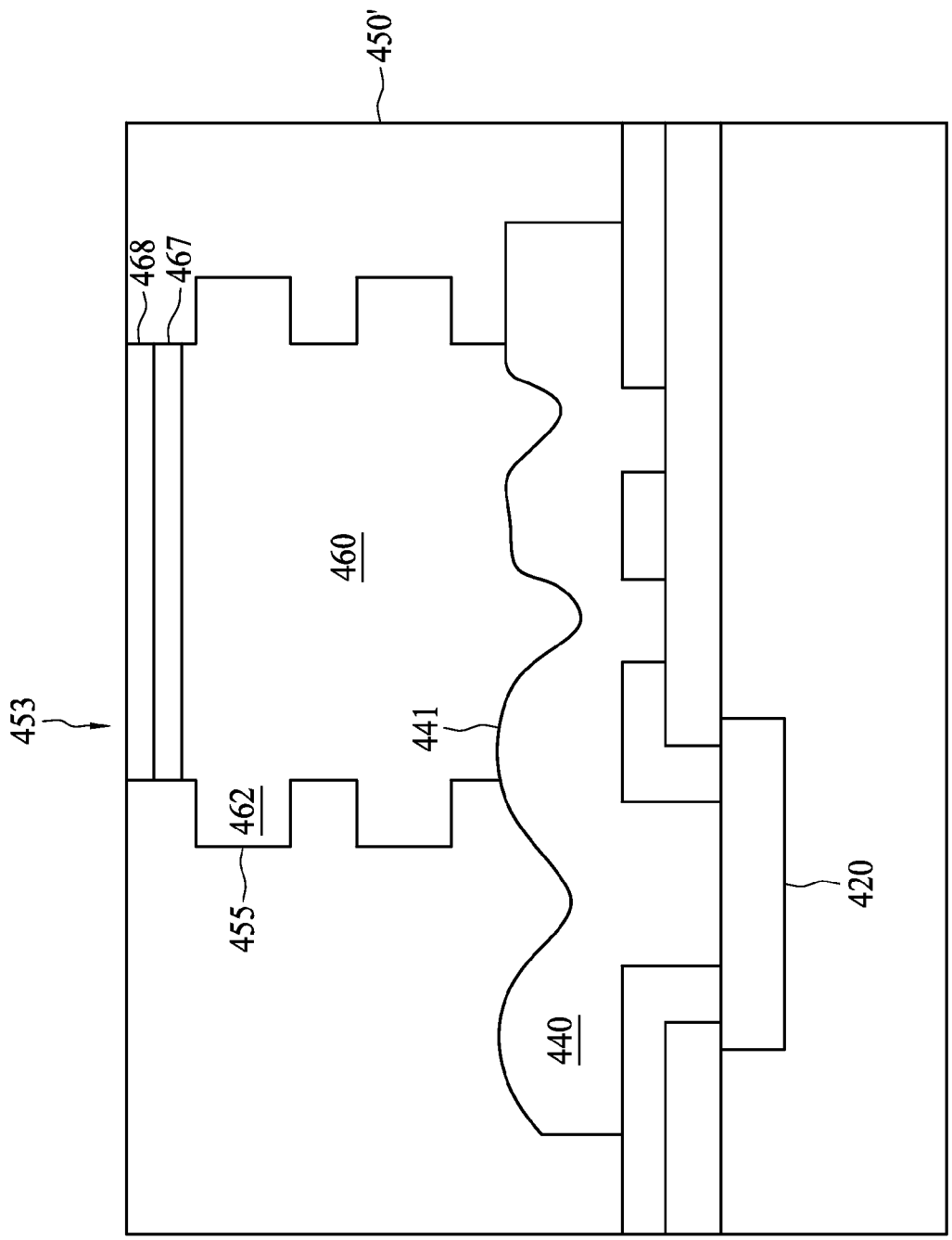

Referring to FIG. 5E, a conductive material is deposited in the opening 453 and the cavities 455 by evaporation, electroplating, or screen printing, thus forming a conductive pillar 460. The conductive material is drawn to fill the cavities 455 and forms a plurality of protruded portions 462. The protruded portions 462 are shaped by the profile of the cavities 455 in the photoresist 450'. The conductive pillar 460 is formed over the PPI layer 440, wherein the conductive pillar 460 interfaces with the uneven surface 441. Next, a cap layer 467 is formed on the conductive pillar 460 within the opening 453. A solder layer 468 is formed on the cap layer 467 in the opening 453.

Figure 5F:
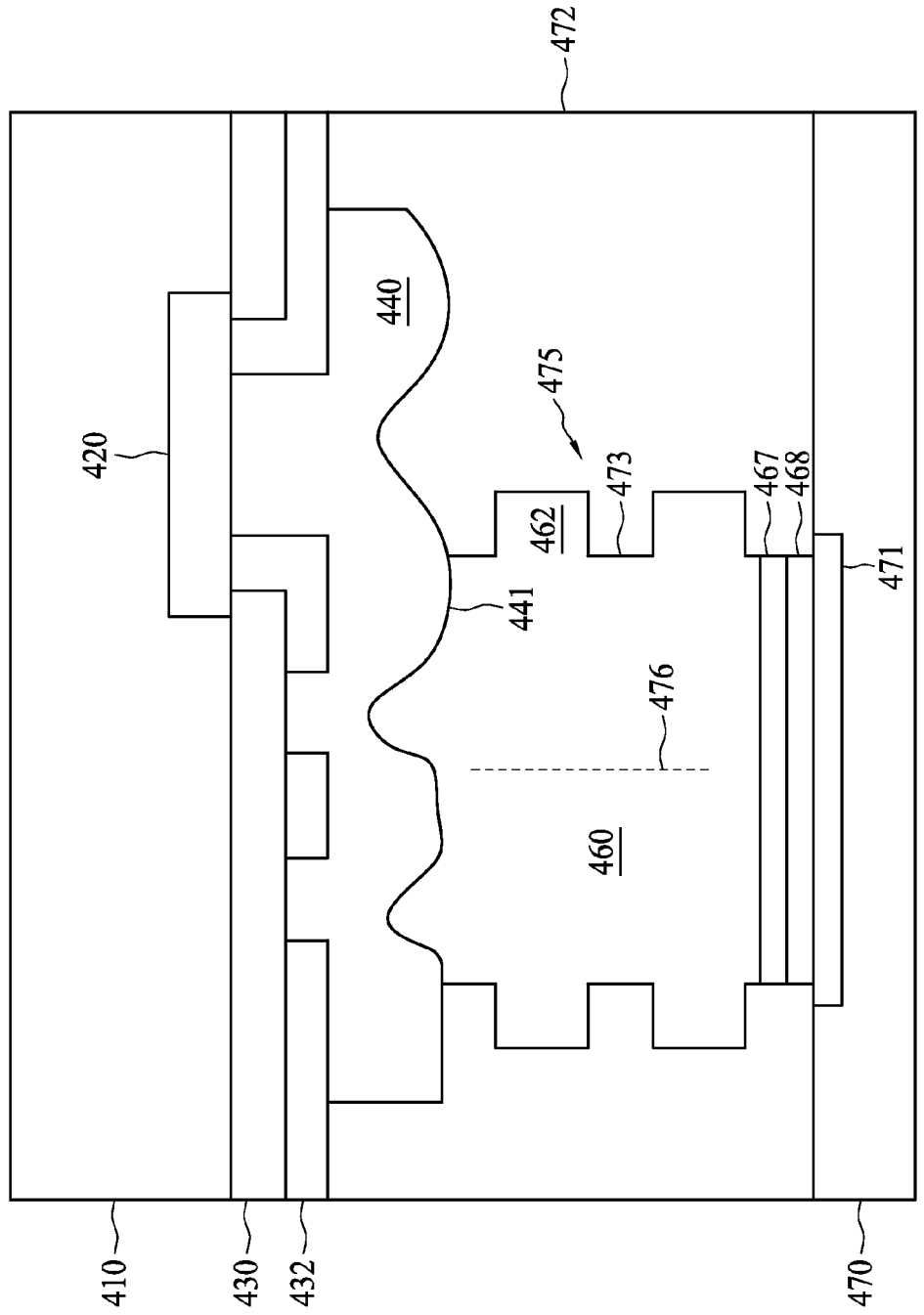

Referring to FIG. 5F, the semiconductor substrate 410 is mounted on a semiconductor substrate 470 or a circuit board. During the mounting process with the semiconductor substrate 470, the semiconductor substrate 410 is flipped upside down and aligned with a conductive region 471 of the semiconductor substrate 470. The solder layer 468 is in contact with the conductive region 471. A reflow process is performed to soften the solder layer 468 for electrical connection and mechanical attachment between the conductive pillar 460 and the semiconductor substrate 470. After the conductive pillar 460 is connected to the semiconductor substrate 470, an underfill 472 is dispensed into gaps between the semiconductor substrates 410 and 470, wherein the underfill 472 surrounds the conductive pillar 460.

The conductive pillar 460 includes a sidewall 475 with a rough surface including a plurality of protruded portions 462 and notches 473, thus increasing degree of surface roughness of the sidewall 475. The notches 473 are notching toward the longitudinal axis 476. The sidewall 475 has a roughness (Ra) greater than about 2 μm. In some embodiments, the sidewall 475 has a roughness (Ra) of about 1 μm to about 3 μm. By using the uneven surface 441 during exposure, the conductive pillar 460 is shaped and molded to have the protruded portions 462 and the notches 473, which increase a contact area of the conductive pillar 460 and other materials. The adhesion ability between the conductive pillar 460 and other materials such as the underfill 475 is enhanced so as to avoid splitting. Due to higher adhesion ability, the delamination or cracks from the interface between the conductive pillar 460 and other materials can be reduced or avoided during a stress testing or a thermal cycle.

In brief, sidewalls of the conductive pillar include a plurality of protruded portions and notches, which increase degree of surface roughness of the sidewalls so that a contact area of the conductive pillar and other materials is increased. The adhesion ability between the conductive pillar and other materials is enhanced so as to avoid splitting. Due to higher adhesion ability, the delamination or cracks from the interface between the conductive pillar and other materials can be reduced or avoided during a stress testing or a thermal cycle.

A semiconductor package structure includes a first semiconductor substrate including a conductive pad; and a conductive pillar on the conductive pad and disposed between the first semiconductor substrate and a second semiconductor substrate. The conductive pad is coupled with a circuitry of the first semiconductor substrate. The conductive pillar extends along a longitudinal axis and toward the second semiconductor substrate. The conductive pillar includes a sidewall with a rough surface notching toward the longitudinal axis.

In some embodiments, the rough surface includes a width greater than about 2 μm.

In some embodiments, the sidewall includes a plurality of protruded portions with a rectangular shape protruding away from the longitudinal axis.

In some embodiments, the sidewall includes a plurality of protruded portions with a sawtooth shape protruding away from the longitudinal axis.

In some embodiments, the sidewall includes a plurality of protruded portions with a curved shape protruding away from the longitudinal axis.

In some embodiments, the conductive pad includes a plurality of recesses. A bottom surface of the conductive pillar interfaces with the plurality of recesses.

In some embodiments, the conductive pad includes a rough surface with wavy curves. A bottom surface of the conductive pillar interfaces with the rough surface.

In some embodiments, the semiconductor package structure further includes an under bump metallization (UBM) between the conductive pillar and the conductive pad, wherein the UBM includes a rough surface with a plurality of recesses facing the conductive pillar.

In some embodiments, the semiconductor package structure further includes a polymeric layer on the first semiconductor substrate; and an under bump metallization (UBM) between the conductive pillar and the conductive pad. The polymeric layer exposes a portion of the conductive pad, thus allowing a portion of the polymeric layer to remain on the conductive pad. The UBM connects to the conductive pad and interfaces the portion of the polymeric layer on the conductive pad.

In some embodiments, the first semiconductor substrate includes a conductive route underneath the conductive pad and coupled with the circuitry. The conductive pad is conformal to an uneven surface resulting from the conductive route.

In some embodiments, the semiconductor package structure further includes an underfill material between the first and second semiconductor substrates, wherein the underfill material surrounds the sidewall and interfaces the rough surface.

A semiconductor package structure includes a first semiconductor substrate including a conductive pad; a passivation layer on the first semiconductor substrate; a polymeric layer over the first semiconductor substrate; an interconnector connected to the conductive pad; and a conductive pillar on the interconnector and disposed over the portion of the passivation layer. The conductive pad is coupled with a circuitry of the first semiconductor substrate. The passivation layer exposes a portion of the conductive pad. The polymeric layer includes a layout exposing the portion of the conductive pad and a portion of the passivation layer. The interconnector contacts the polymeric layer and the portion of the passivation layer. The conductive pillar is disposed between the first semiconductor substrate and a second semiconductor substrate. The conductive pillar extends along a longitudinal axis and toward the second semiconductor substrate. The conductive pillar includes a sidewall with a rough surface notching toward the longitudinal axis.

In some embodiments, the interconnector includes an uneven surface interfacing the conductive pillar.

In some embodiments, the exposure of the portion of the passivation layer is underneath the conductive pillar.

In some embodiments, the rough surface includes a roughness (Ra) greater than about 2 μm.

A method for manufacturing a semiconductor package structure includes: providing a semiconductor substrate including a conductive pad; forming a patterned passivation layer to expose a portion of the conductive pad; forming an uneven surface of the conductive pad; forming a photoresist on the semiconductor substrate; exposing the photoresist under a light beam, wherein the light beam is scattered by the uneven surface; developing the photoresist to form an opening in the photoresist so as to expose the conductive pad and form a plurality of cavities in the remaining photoresist; and forming a conductive material in the opening and the plurality of cavities. The conductive pad is coupled with a circuitry of the semiconductor substrate.

In some embodiments, the method further includes forming a patterned photoresist on the semiconductor substrate, wherein the patterned photoresist includes an opening to expose a portion of the conductive pad; and recessing the conductive pad through the opening.

In some embodiments, the method further includes performing an etch process on the conductive pad through the patterned passivation layer.

In some embodiments, the method further includes remaining a portion of the patterned passivation layer on the conductive pad; and forming an under bump metallization (UBM) on the conductive pad and the portion of the patterned passivation layer.

In some embodiments, the method further includes forming a conductive route underneath the conductive pad and coupled with the circuitry.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package structure, comprising:
    a first semiconductor substrate comprising a conductive pad, the conductive pad comprises a plurality of recesses,
    wherein the conductive pad is coupled with a circuitry of the first semiconductor substrate;
    a conductive pillar on the conductive pad and disposed between the first semiconductor substrate and a second semiconductor substrate, wherein the conductive pillar:
    extends along a longitudinal axis and toward the second semiconductor substrate, and includes a sidewall with a rough surface notching toward the longitudinal axis, and wherein the rough surface comprises a width greater than about 2 µm, and
    wherein a bottom surface of the conductive pillar interfaces with the plurality of recesses of the conductive pad.

2. The semiconductor package structure of claim 1, wherein the width of the rough surface is ranged from about 2 µm to 3.5 µm.

3. The semiconductor package structure of claim 1, wherein the sidewall comprises a plurality of protruded portions with a rectangular shape protruding away from the longitudinal axis.

4. The semiconductor package structure of claim 1, wherein the sidewall comprises a plurality of protruded portions with a sawtooth shape protruding away from the longitudinal axis.

5. The semiconductor package structure of claim 1, wherein the sidewall comprises a plurality of protruded portions with a curved shape protruding away from the longitudinal axis.

6. The semiconductor package structure of claim 1, wherein the conductive pad comprises a rough surface with wavy curves, and a bottom surface of the conductive pillar interfaces with the rough surface.

7. The semiconductor package structure of claim 1, further comprising:
    an under bump metallization (UBM) between the conductive pillar and the conductive pad, wherein the UBM comprises a rough surface with a plurality of recesses facing the conductive pillar.

8. The semiconductor package structure of claim 1, further comprising:
    a polymeric layer on the first semiconductor substrate, wherein the polymeric layer exposes a portion of the conductive pad, thus allowing a portion of the polymeric layer to remain on the conductive pad; and
    an under bump metallization (UBM) between the conductive pillar and the conductive pad, wherein the UBM connects to the conductive pad and interfaces the portion of the polymeric layer on the conductive pad.

9. The semiconductor package structure of claim 1, wherein the first semiconductor substrate comprises a conductive route underneath the conductive pad and is coupled with the circuitry, and the conductive pad is conformal to an uneven surface resulting from the conductive route.

10. The semiconductor package structure of claim 1, further comprising:
    an underfill material between the first and second semiconductor substrates, wherein the underfill material surrounds the sidewall and interfaces the rough surface.

11. A semiconductor package structure, comprising:
    a first semiconductor substrate comprising a conductive pad, wherein the conductive pad is coupled with a circuitry of the first semiconductor substrate;
    a passivation layer on the first semiconductor substrate, wherein the passivation layer exposes a plurality portion of the conductive pad;
    a polymeric layer over the first semiconductor substrate, wherein the polymeric layer comprises a layout exposing the portion of the conductive pad and plurality portions of the passivation layer;
    an interconnector connected to the conductive pad, wherein the interconnector contacts the polymeric layer and the plurality portions of the passivation layer; and
    a conductive pillar on the interconnector and disposed over the portion of the passivation layer , wherein the conductive pillar is disposed between the first semiconductor substrate and a second semiconductor substrate , and extends along a longitudinal axis and toward the second semiconductor substrate, and includes a sidewall with a rough surface notching toward the longitudinal axis,
    wherein the interconnector comprises an uneven surface interfacing the conductive pillar,
    wherein the exposure of the plurality portions of the passivation layer is underneath the conductive pillar.

12. The semiconductor package structure of claim 11, wherein the rough surface includes a roughness (Ra) greater than about 2 µm.

* * * * *